(12) United States Patent
Chou et al.

(10) Patent No.: US 12,142,608 B2
(45) Date of Patent: *Nov. 12, 2024

(54) SEMICONDUCTOR DEVICE AND METHOD FOR MAKING THE SAME

(71) Applicant: TAIWAN SEMICONDUCTOR MANUFACTURING COMPANY, LTD., Hsinchu (TW)

(72) Inventors: Pei-Yu Chou, Hsinchu (TW); Yi-Ting Fu, Hsinchu (TW); Ting-Gang Chen, Hsinchu (TW); Tze-Liang Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/308,229

(22) Filed: Apr. 27, 2023

(65) Prior Publication Data
US 2023/0268347 A1    Aug. 24, 2023

Related U.S. Application Data

(63) Continuation of application No. 17/313,451, filed on May 6, 2021, now Pat. No. 11,652,106.

(51) Int. Cl.
| *H01L 29/76* | (2006.01) |
| *H01L 27/092* | (2006.01) |
| *H01L 29/06* | (2006.01) |
| *H01L 29/66* | (2006.01) |
| *H01L 29/78* | (2006.01) |
| *H01L 29/94* | (2006.01) |

(52) U.S. Cl.
CPC ...... *H01L 27/0924* (2013.01); *H01L 29/0649* (2013.01); *H01L 29/66795* (2013.01); *H01L 29/7851* (2013.01)

(58) Field of Classification Search
CPC ............ H01L 27/0924; H01L 29/0649; H01L 29/66795; H01L 29/7851; H01L 29/4991; H01L 21/823431; H01L 29/66545
USPC ........................................................ 257/288
See application file for complete search history.

(56) References Cited

U.S. PATENT DOCUMENTS

| 11,652,106 B2 * | 5/2023 | Chou .................. H01L 29/0649 257/288 |
| 2003/0113968 A1 | 6/2003 | Thakur |
| 2019/0305099 A1 | 10/2019 | Jo et al. |

* cited by examiner

*Primary Examiner* — Theresa T Doan
(74) *Attorney, Agent, or Firm* — Birch, Stewart, Kolasch & Birch, LLP

(57) ABSTRACT

A semiconductor device includes a plurality of semiconductor fins, at least one gate stack, a refill isolation, and an air gap. Each of the semiconductor fins extends in an X direction. Two adjacent ones of the semiconductor fins are spaced apart from each other in a Y direction transverse to the X direction. The at least one gate stack has two stack sections spaced apart from each other in the Y direction. The stack sections are disposed over two adjacent ones of the semiconductor fins, respectively. The refill isolation and the air gap are disposed between the stack sections.

20 Claims, 32 Drawing Sheets

SEMICONDUCTOR DEVICE AND METHOD FOR MAKING THE SAME

PRIORITY CLAIM AND CROSS-REFERENCE

This application is a continuation of U.S. patent application Ser. No. 17/313,451, filed on May 6, 2021, which is hereby expressly incorporated by reference into the present application.

BACKGROUND

With the dramatic development of the semiconductor manufacturing technology, the semiconductor integrated circuit (IC) chip can be scaled down with an increased functional density (i.e., the number of electrical devices per chip area). For example, in a semiconductor IC chip with three-dimensional transistors, FEOL (front-end-of-line) metal gate (MG) structure is being cut to obtain a plurality of metal gate portions, and each of the metal gate portions can be used in an individual transistor. Nevertheless, in order to meet application needs, improvement of the electrical characteristics of a semiconductor IC chip is still required, such as lowering device capacitance for reducing resistive-capacitive delay.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
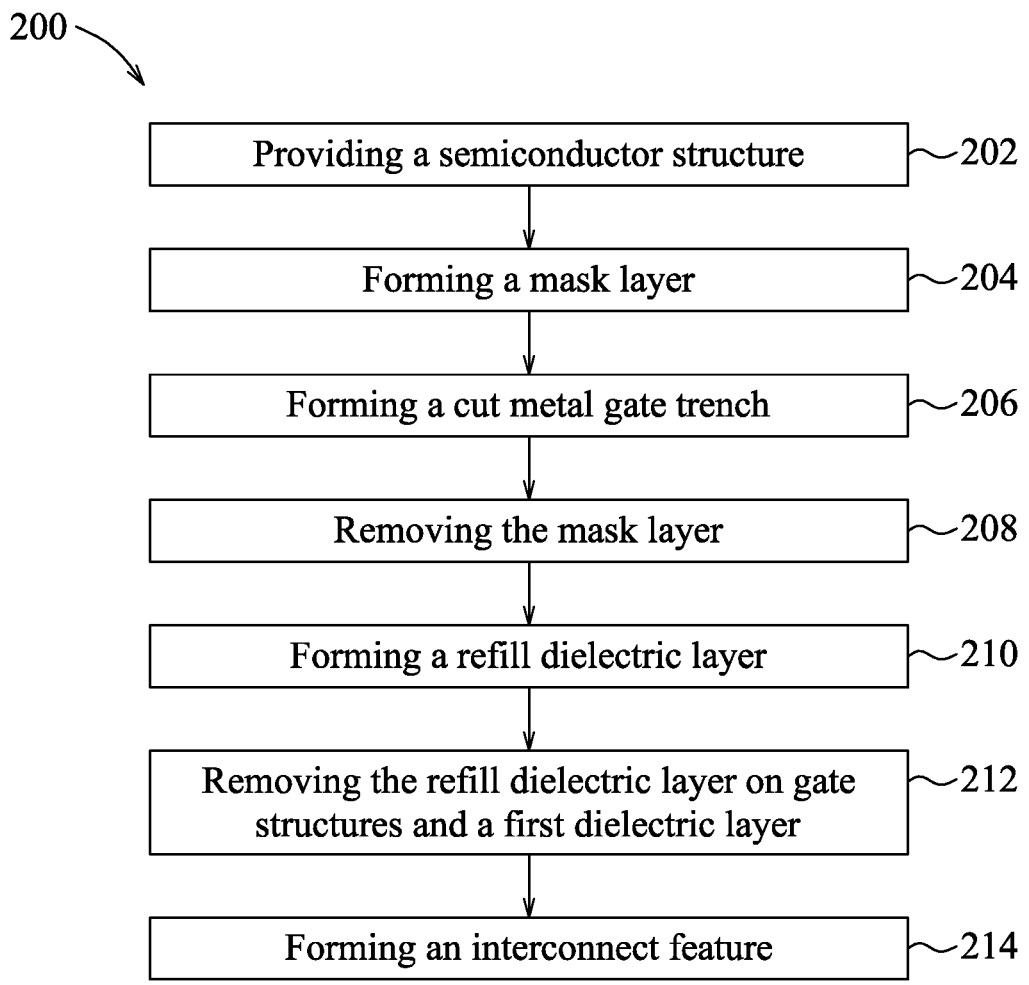
FIG. 1 illustrates a process flow for making a semiconductor device in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a process flow for making a semiconductor device in accordance with some embodiments. FIGS. 2 to 18 illustrate schematic views of intermediate stages in the formation of a semiconductor structure in accordance with some embodiments as depicted in FIG. 1.

Figure 2:
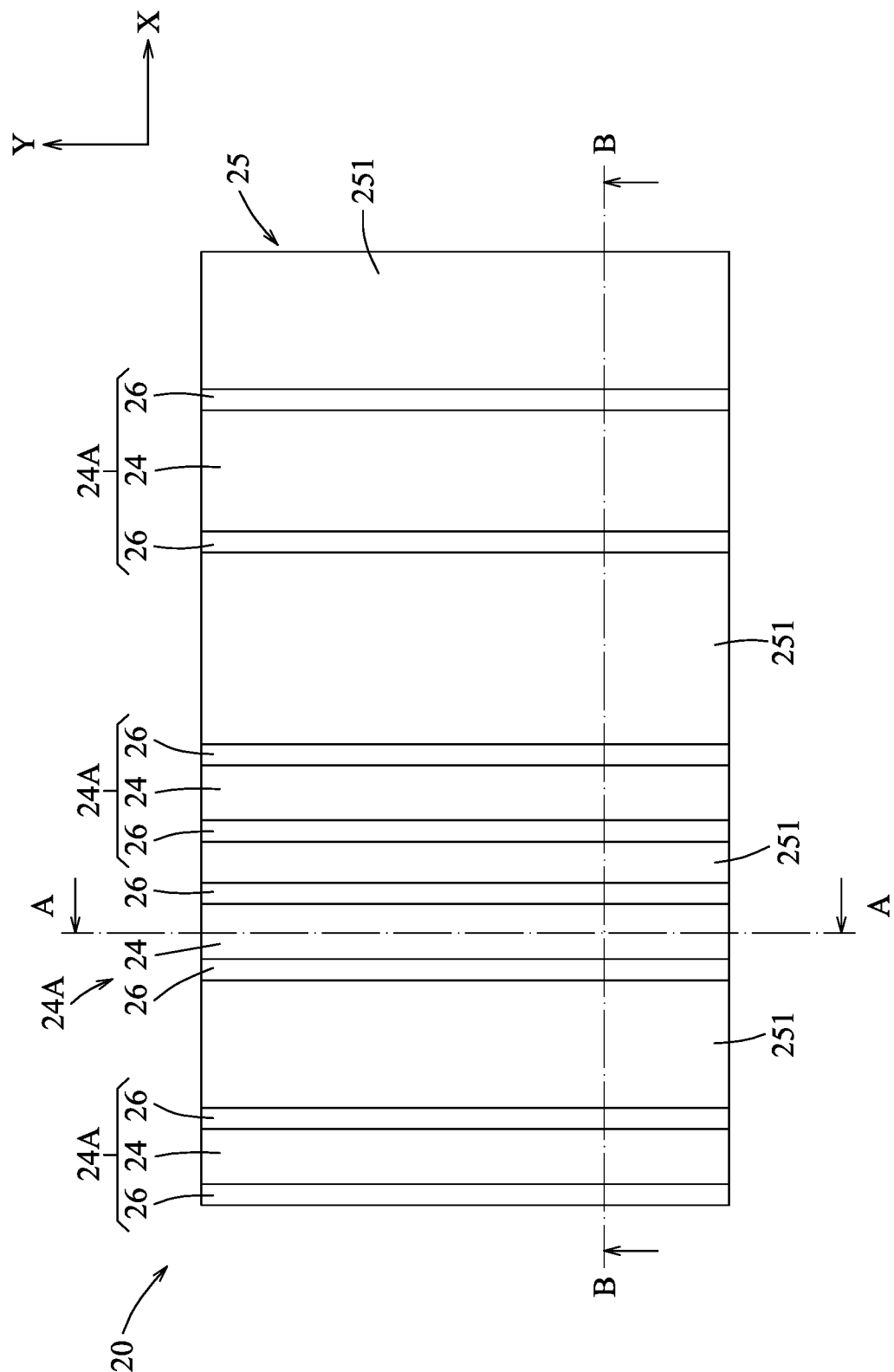
FIGS. 2 to 31 illustrate intermediate stages of the method for manufacturing the semiconductor device in accordance with some embodiments as depicted in FIG. 1.
Figure 3:
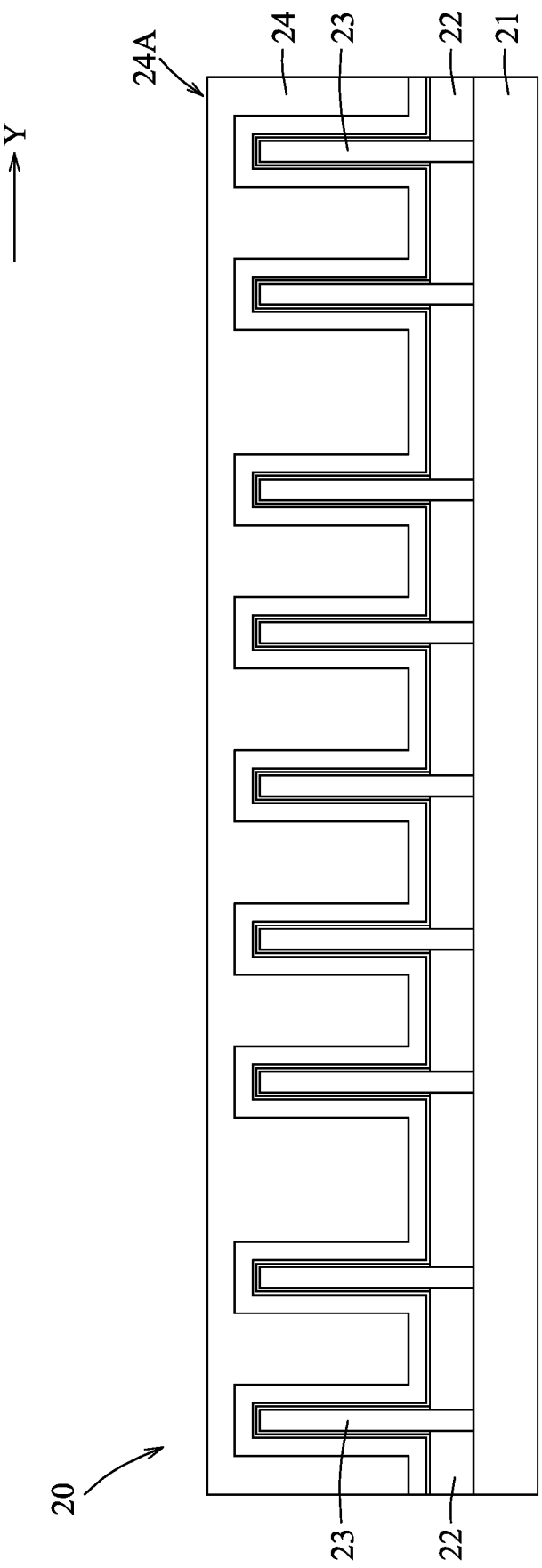
Figure 4:
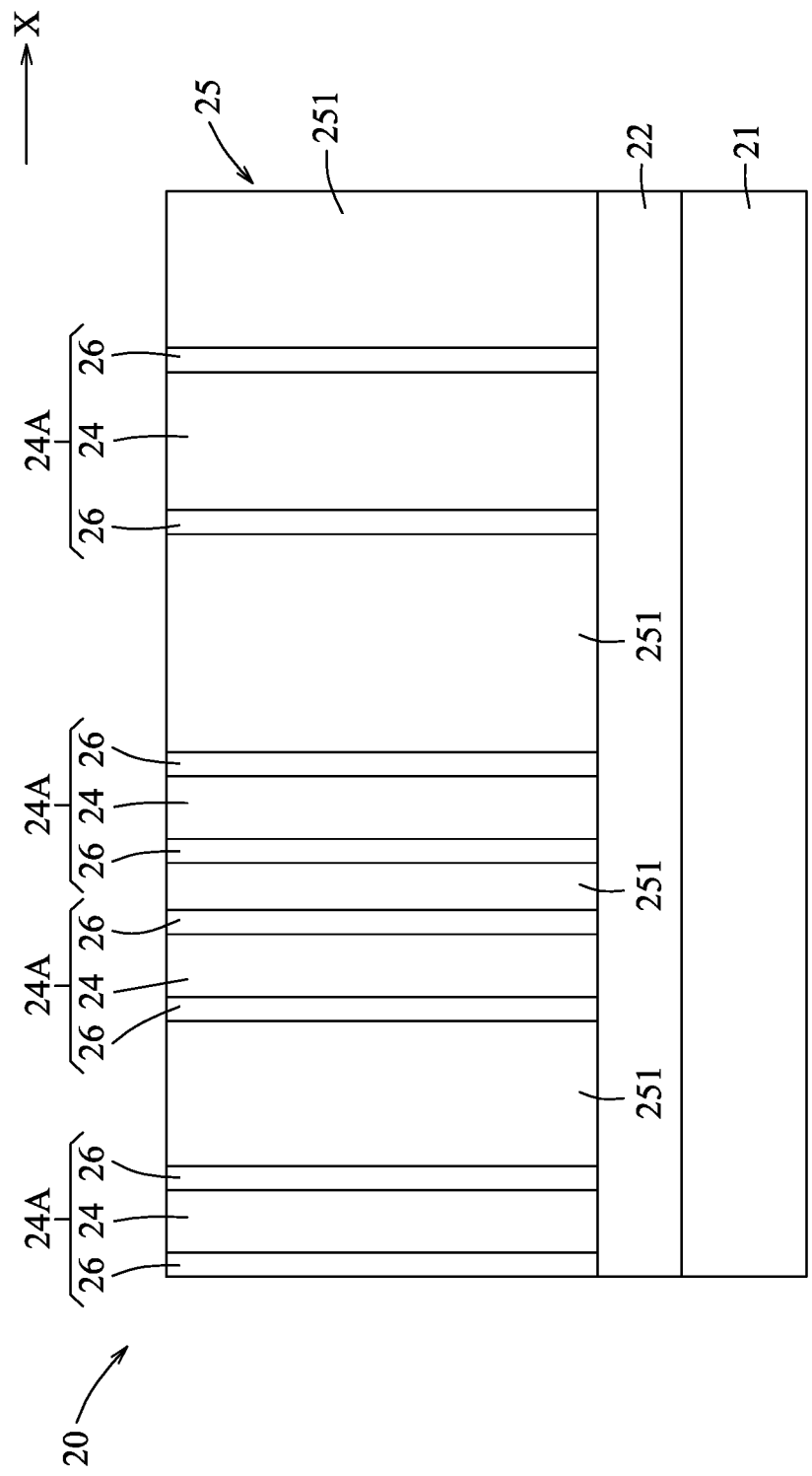
Figure 5:
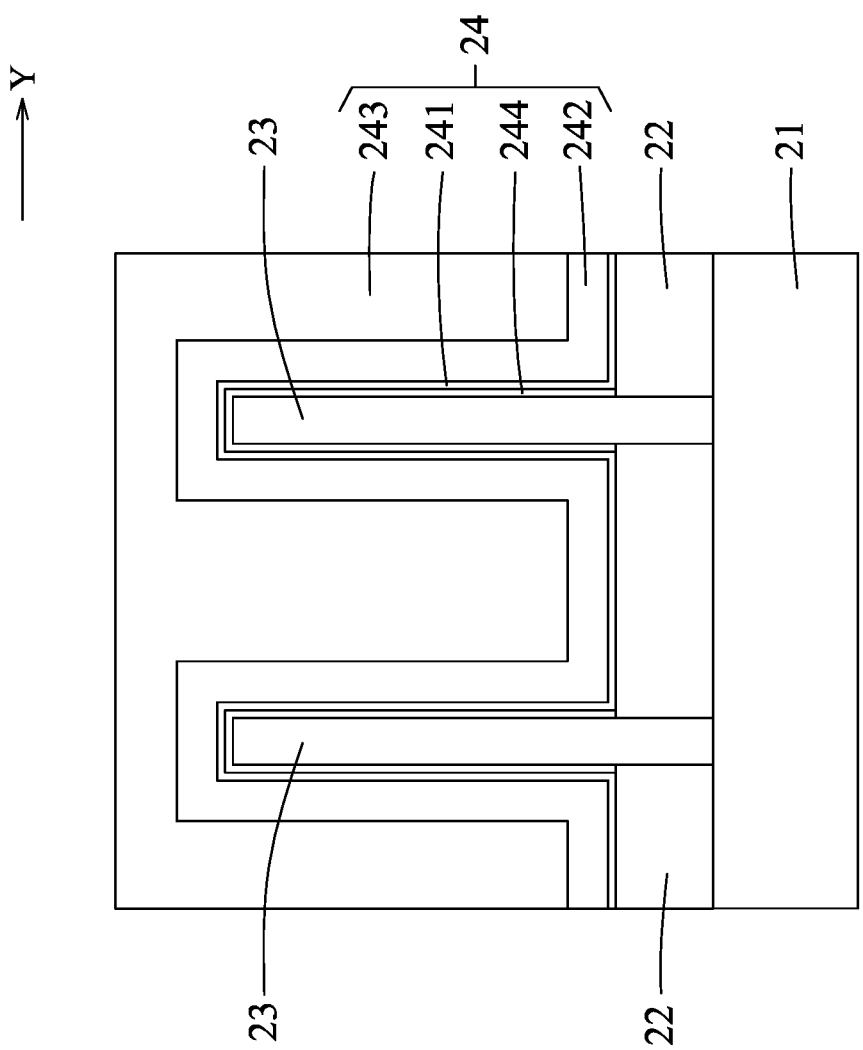

FIG. 2 is a schematic top view of a semiconductor structure 20 in accordance with some embodiments. FIGS. 3 and 4 are schematic cross-sectional views taken along line A-A in a Y direction and line B-B in an X direction of FIG. 2, respectively. FIG. 5 is a partially enlarged view of FIG. 3.

Referring to FIGS. 2 to 5, the semiconductor structure 20 is provided. This process is illustrated as process 202 in the flow chart 200 shown in FIG. 1. The semiconductor structure 20 includes a substrate 21, a plurality of isolation regions 22, a plurality of semiconductor fins 23, a plurality of gate stacks 24, a first dielectric layer 25, and a plurality of gate spacers 26. The substrate 21 may be an elemental semiconductor substrate or a compound semiconductor substrate. The elemental semiconductor substrate may be made from single species of atoms, such as silicon (Si), germanium (Ge), or other suitable materials. The compound semiconductor substrate may include two or more elements, such as silicon carbide (SiC), silicon germanium (SiGe), gallium arsenide (GaAs), gallium phosphide (GaP), indium phosphide (InP), indium arsenide (InAs), indium antimonide (InSb), gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP) or other suitable materials. In some embodiments, the substrate 21 may be doped with a suitable p-type dopant, such as boron (B), aluminum (Al), gallium (Ga) or other suitable materials, or may alternatively be doped with a suitable n-type dopant, such as phosphorous (P), antimony (Sb), arsenic (As) or other suitable materials. The isolation regions 22 may be formed in the substrate 21. In some embodiments, the isolation regions 22 may be shallow trench isolation (STI) regions that are formed by etching the substrate 21 to form a plurality of trenches (not shown), and then filling the trenches with a dielectric material to thereby form the STI regions. The dielectric material for forming the STI regions may be made of a suitable material, such as silicon oxide, silicon nitride, silicon oxynitride, low dielectric constant (k) material, high-k material, other suitable materials, or any combination thereof. The dielectric material may be filled in the trenches using, for example, atomic layer deposition (ALD), chemical vapor deposition (CVD), spin-on coating or other suitable techniques. In some embodiments, the isolation regions 22, which cooperatively serve as an isolation structure, may be disposed on the substrate 21 among lower portions of the semiconductor fins 23 (see FIG. 3). The semiconductor fins 23 are defined among the isolation regions 22 and extend in the X direction. Two adjacent ones of the semiconductor fins 23 are spaced apart from each other in the Y direction. The semiconductor fins 23 may include, for example, silicon, silicon germanium, silicon boride, other suitable materials, or any combination thereof. In some embodiments, the semiconductor fins 23 may be made of the same material as the substrate 21;

in other embodiments, the semiconductor fins 23 and the substrate 21 may be made of different materials. The gate stacks 24 are formed over the isolation regions 22 and the semiconductor fins 23 opposite to the substrate 21 and extend in the Y direction. Two adjacent ones of the gate stacks 24 are spaced apart from each other in the X direction. In some embodiments, each of the gate stacks 24 may be a metal gate stack, and may include a high-k dielectric layer 241, a work function metal layer 242 and a metal fill layer 243. The high-k dielectric layer 241 is conformally formed over the isolation regions 22 and the semiconductor fins 23. In some embodiments, the high-k dielectric layer 241 may include, but not limited to, hafnium silicon oxide (HfSiO), hafnium oxide ($HfO_2$), alumina ($Al_2O_3$), zirconium oxide ($ZrO_2$), lanthanum oxide ($La_2O_3$), titanium oxide ($TiO_2$), yttrium oxide ($Y_2O_3$), strontium titanate ($SrTiO_3$), other suitable materials, or any combination thereof. The high-k dielectric layer 241 may be formed using, for example, ALD, CVD or other suitable techniques. The work function metal layer 242 is conformally formed over the high-k dielectric layer 241. In some embodiments, the work function metal layer 242 may include a p-type semiconductor material, such as titanium nitride (TiN), tantalum nitride (TaN), ruthenium (Ru), molybdenum (Mo), tungsten (W), tungsten nitride (WN), platinum (Pt), zirconium disilicide ($ZrSi_2$), molybdenum disilicide ($MoSi_2$), tantalum disilicide ($TaSi_2$), nickel disilicide ($NiSi_2$), other suitable materials, or any combination thereof. Alternatively, the work function metal layer 242 may include an n-type semiconductor material, such as titanium (Ti), aluminum (Al), silver (Ag), manganese (Mn), zirconium (Zr), tantalum carbide (TaC), tantalum carbide nitride (TaCN), tantalum silicon nitride (TaSiN), titanium silicon nitride (TiSiN), other suitable materials, or any combination thereof. The work function metal layer 242 may be formed using, for example, ALD, CVD, physical vapor deposition (PVD) or other suitable techniques. The metal fill layer 243 is formed over the work function metal layer 242. The metal fill layer 243 may include, but not limited to, aluminum (Al), tungsten (W), cobalt (Co), other suitable materials, or any combination thereof. The metal fill layer 243 may be formed by conformally depositing a material for forming the metal fill layer 243 over the work function metal layer 242 using, for example, CVD, PVD, electroless plating or other suitable techniques, followed by a planarization process such as a chemical mechanical polish (CMP) process or other suitable techniques. In some embodiments, each of the gate stacks 24 may further include an interfacial layer 244 disposed between the semiconductor fins 23 and the high-k dielectric layer 241. The interfacial layer 244 may include, but not limited to, silicon oxide, silicon oxynitride, other suitable materials, or any combination thereof. The interfacial layer 244 may be formed using, for example, ALD, CVD, thermal oxidation or other suitable techniques. Opposite sidewalls of each of the gate stacks 24 may be formed with two of the gate spacers 26. The gate spacers 26 may include, but not limited to, silicon oxide, silicon nitride, silicon carbide, silicon oxyniride, other suitable materials, or any combination thereof. The gate spacers 26 may be formed using, for example, CVD, ALD or other suitable techniques, to form a gate spacer layer (not shown) and then etching the gate spacer layer to form the gate spacers 26. Each of the gate stacks 24 and two corresponding ones of the gate spacers 26 cooperatively form a gate structure 24A, and thus, the semiconductor structure 20 includes a plurality of the gate structures 24A. The first dielectric layer 25 is formed over the substrate 21. In some embodiments, the first dielectric layer 25 may include, but not limited to, undoped silicate glass (USG), phosphosilicate glass (PSG), borosilicate glass (BSG), boron-doped phosphosilicate glass (BPSG), fluorine-doped silicate glass (FSG), silicon dioxide ($SiO_2$), SiOC-based materials (e.g., SiOCH), other suitable materials, or any combination thereof. The first dielectric layer 25 may be formed by conformally depositing a material for forming the first dielectric layer 25 over the gate stacks 24 and the gate spacers 26 using, for example, spin-on coating, flowable chemical vapor deposition (FCVD), plasma-enhanced chemical vapor deposition (PECVD), low pressure chemical vapor deposition (LPCVD), ALD or other suitable techniques, followed by a planarization process such as a CMP process or other suitable techniques to expose the gate stacks 24 and the gate spacers 26. As such, the first dielectric layer 25 has a plurality of dielectric portions 251 to separate the gate structures 24A from each other. In other words, the dielectric portions 251 are disposed to alternate with the gate stacks 24 or the gate structures 24A in the X direction.

Figure 6:
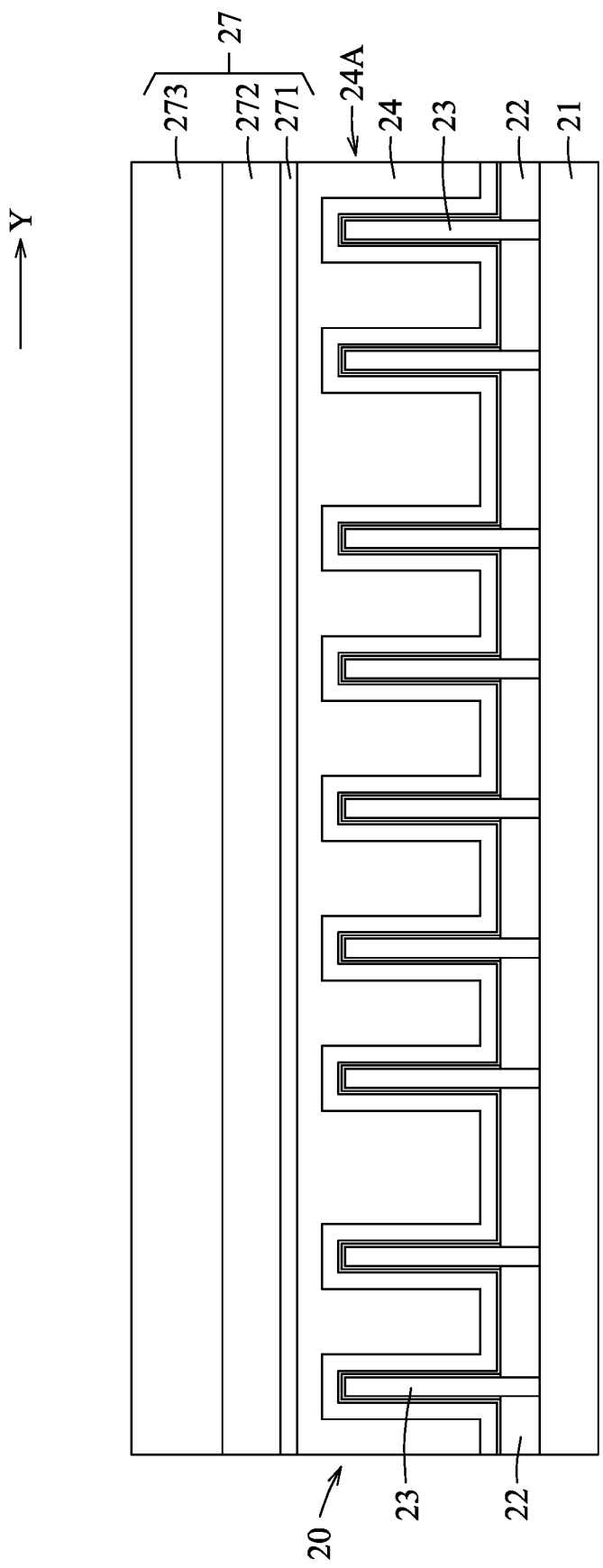
Figure 7:
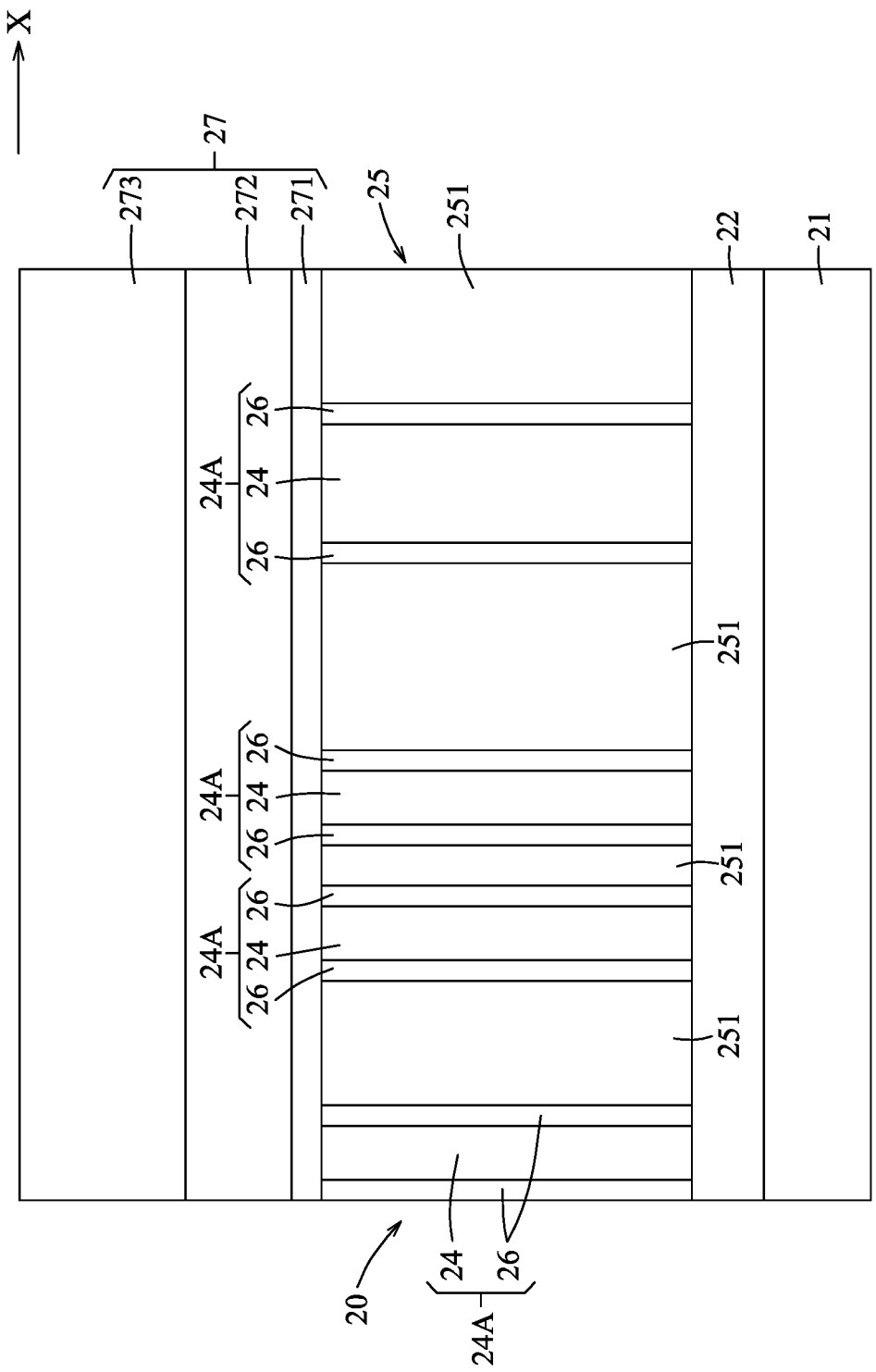

FIGS. 6 and 7 are similar to FIGS. 3 and 4, respectively, but illustrate that, after the provision of the semiconductor structure 20, a mask layer 27 is formed on the gate structures 24A and the first dielectric layer 25. This process is illustrated as process 204 in the flow chart 200 shown in FIG. 1. The mask layer 27 may include a first mask sublayer 271, a second mask sublayer 272, and a third mask sublayer 273 that are sequentially disposed on the gate structures 24A and the first dielectric layer 25 in such order. In some embodiments, each of the first mask sublayer 271 and the second mask sublayer 272 may be a hard mask, and may include, but not limited to, titanium nitride, silicon oxide, silicon nitride, silicon carbide nitride, silicon oxide nitride, metal oxide (e.g., titanium oxide, aluminum oxide or other suitable materials), other suitable materials, or any combination thereof. The first mask sublayer 271 and the second mask sublayer 272 may be formed using, for example, ALD, CVD, PVD or other suitable techniques. In some embodiments, the first mask sublayer 271 and the second mask sublayer 272 may include different materials. In some embodiments, the third mask sublayer 273 may be a soft mask made of a suitable photoresist material. The third mask sublayer 273 may be formed using, for example, spin-on coating or other suitable techniques. In some embodiments, the mask layer 27 may only include the first mask sublayer 271 and the third mask sublayer 273.

Figure 8:
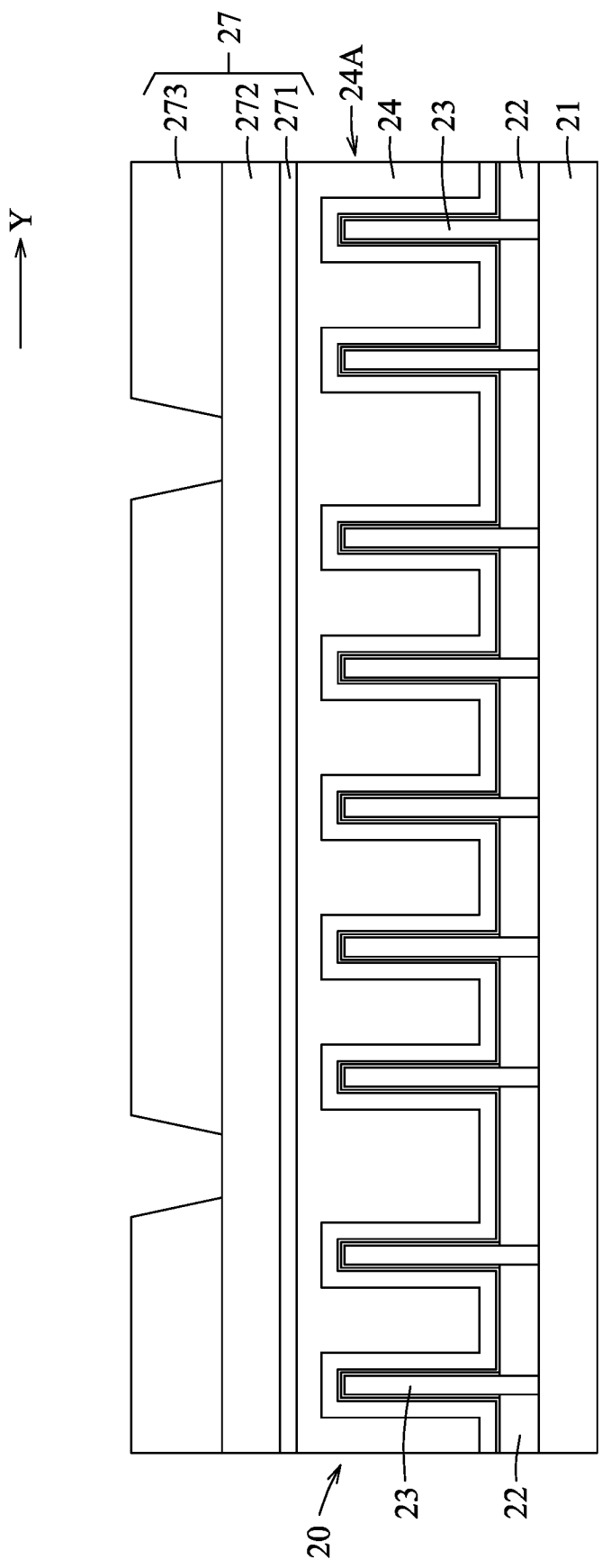
Figure 9:
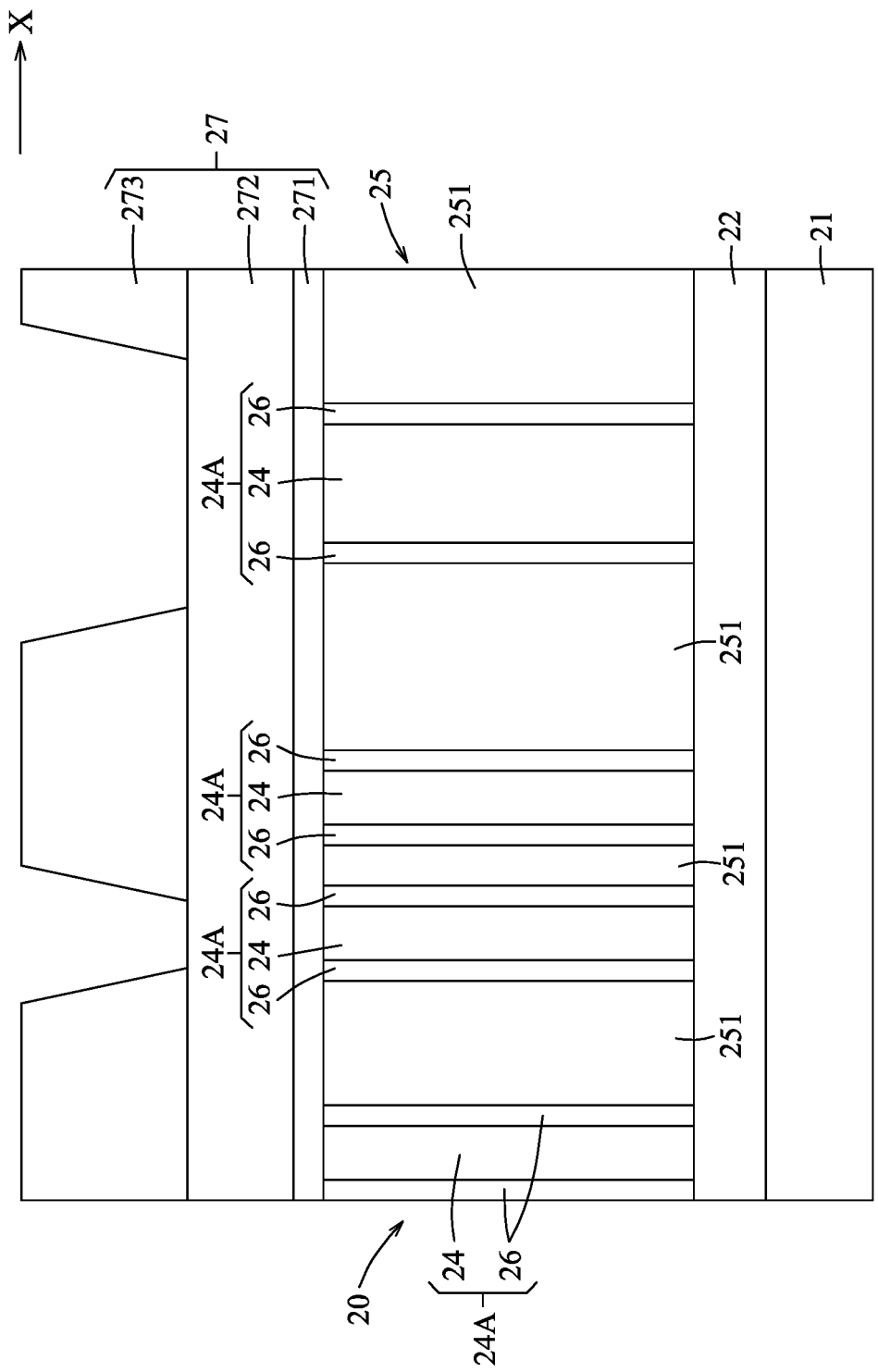
Figure 10:
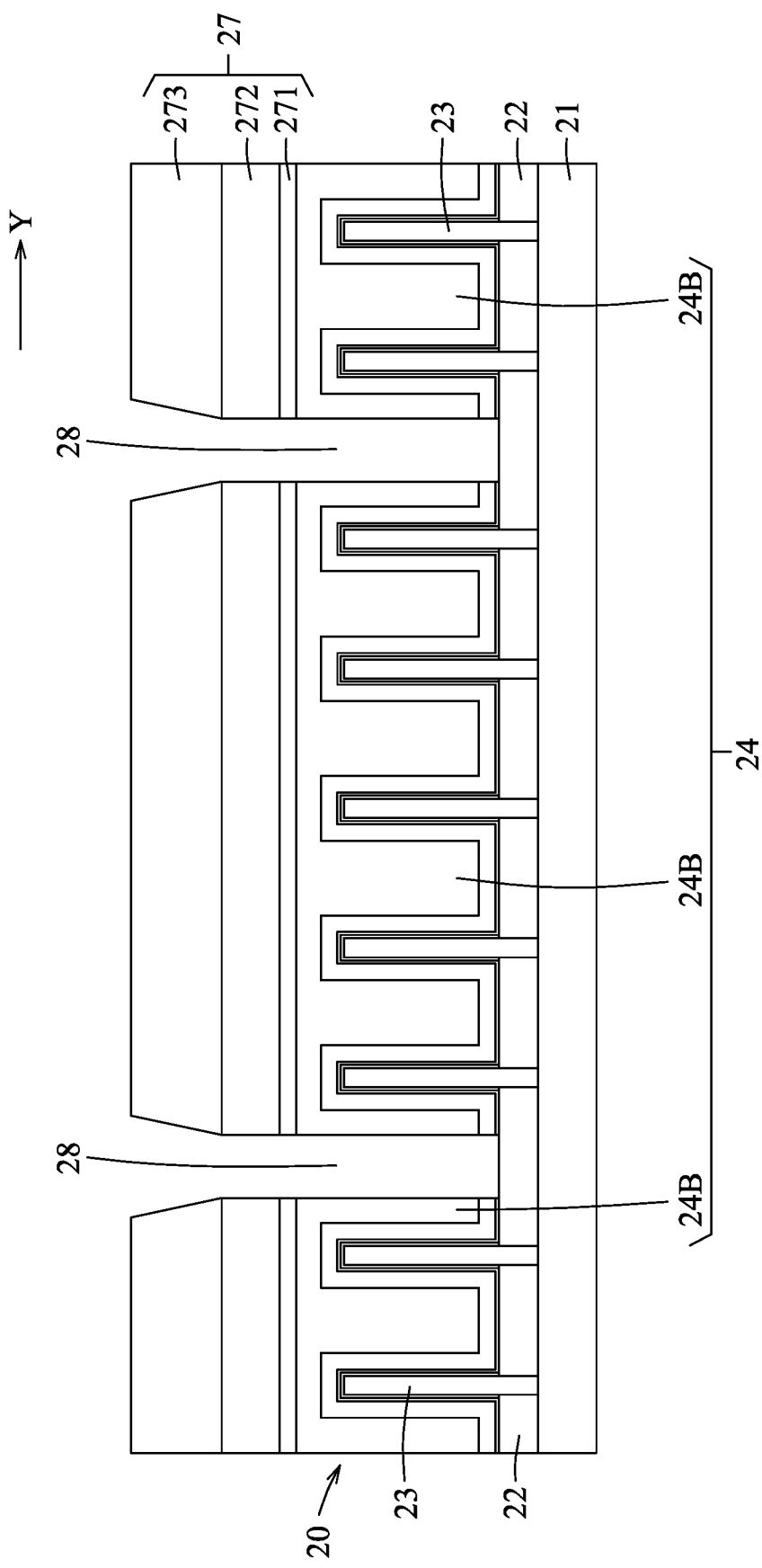
Figure 11:
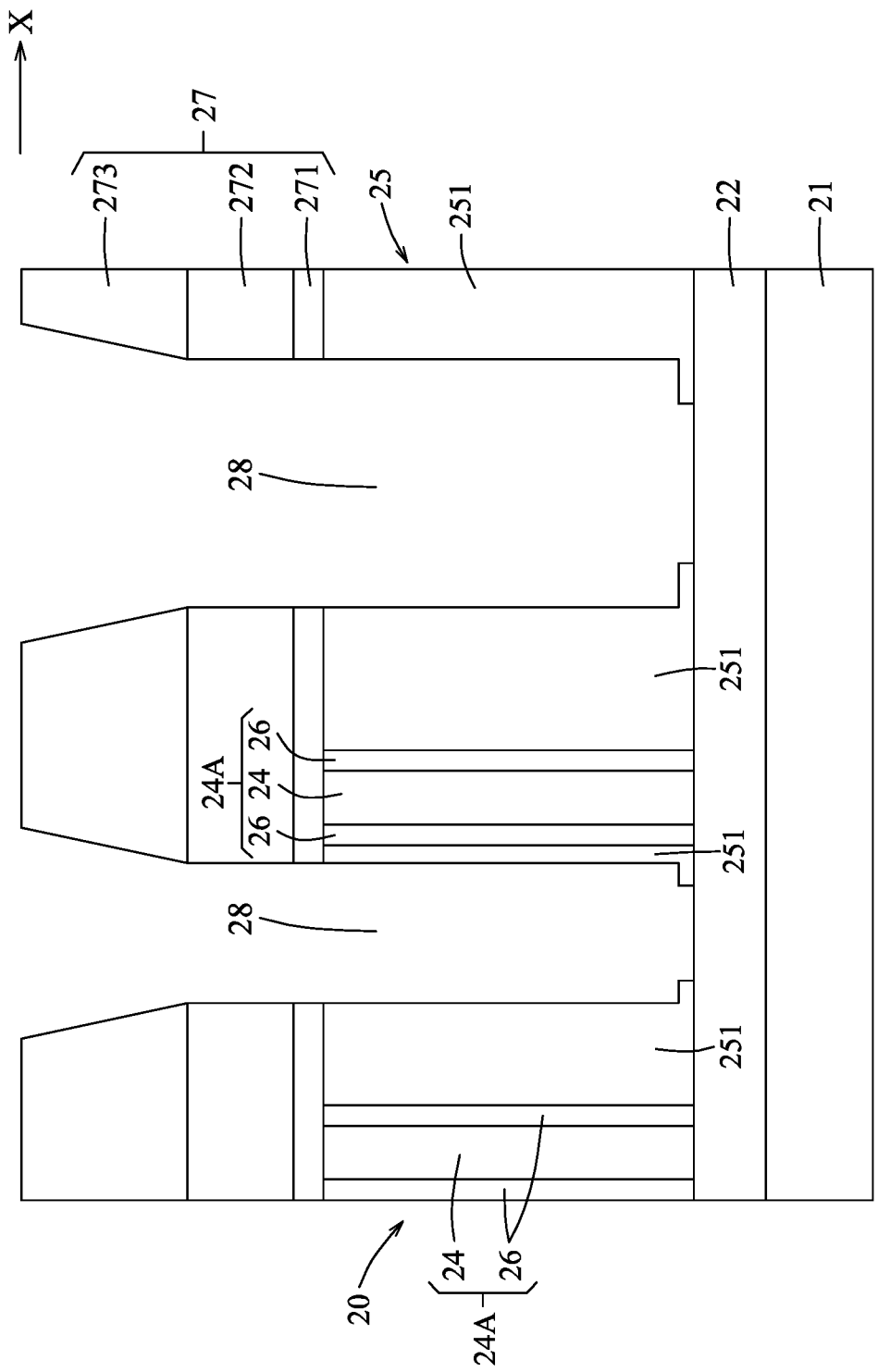

FIGS. 8 and 9 are similar to FIGS. 6 and 7, respectively, but illustrate that, the third mask sublayer 273 is patterned. In addition, FIGS. 10 and 11 are similar to FIGS. 8 and 9, but illustrate that the first mask sublayer 271, the second mask sublayer 272, and some of the gate structures 24A are etched through the patterned third mask sublayer 273 to form a plurality of trenches 28, each of which may be referred to as a cut metal gate (CMG) trench. This process is illustrated as process 206 in the flow chart 200 shown in FIG. 1. In some embodiments, the trenches 28 penetrate corresponding gate structures 24A shown in FIG. 9, and may extend downwardly to terminate at the isolation region 22 (see FIGS. 10 and 11). In some embodiments, each trench 28 may be formed by removing a portion of a corresponding gate stack 24 whilst partially removing the dielectric portions 251 beside the removed portion of the corresponding gate stack 24. In some embodiments, the process of forming the trenches 28 may involve (i) exposing and developing the third mask sublayer 273 shown in FIGS. 6 and 7 to obtain the patterned third mask sublayer 273 shown in FIGS. 8 and 9, (ii) etching the first and second mask sublayers 271, 272 using the patterned third mask sublayer 273 as a mask, and (iii) etching the corresponding gate structures 24A and the first dielectric layer 25 shown in FIGS. 8 and 9 using the etched first and second mask sublayers 271, 272 as a mask to obtain the structure shown in FIGS. 10 and 11. The second mask sublayer 272, the first mask sublayer 271, the corresponding gate structures 24A, and the first dielectric layer 25 may be etched by a suitable etching technique, such as wet etching, dry etching, or a combination thereof. In some embodiments, as shown in FIGS. 10 and 11, a cross-section of each of the trenches 28 may be formed in a rectangular shape, but other geometries (e.g., an inverted trapezoid shape) for the trenches 28 are also within the scope of the disclosure. In some embodiments, for each of the trenches 28, the etching rate for the corresponding gate structure 24A may be higher than that for the first dielectric layer 25, and the trench 28 may therefore have a deeper center portion at a position corresponding to the corresponding gate structure 24A and a shallower side portion at positions corresponding to the first dielectric layer 25. In some embodiments, each of the trenches 28 is formed in the corresponding gate stack 24 to partition the corresponding gate stack 24 into at least two stack sections 24B, and one of which is disposed over a group of the semiconductor fins 23 and the other of which is disposed over another group of the semiconductor fins 23. For example, the gate stack 24 shown in FIG. 10 is partitioned into three stack sections 24B by the trenches 28, where each stack section 24B may independently control the semiconductor fins 23 wrapped thereby.

Figure 12:
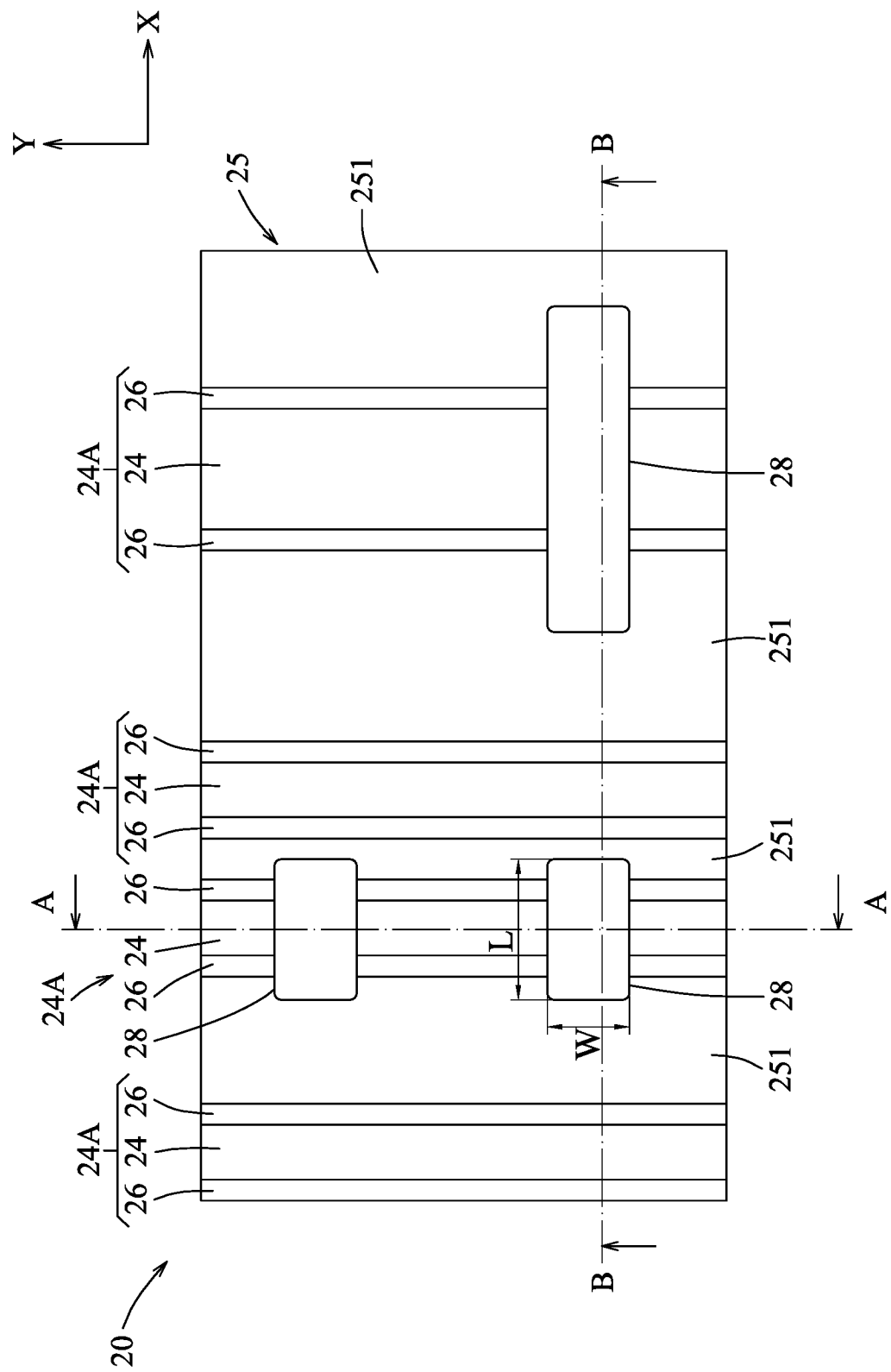
Figure 13:
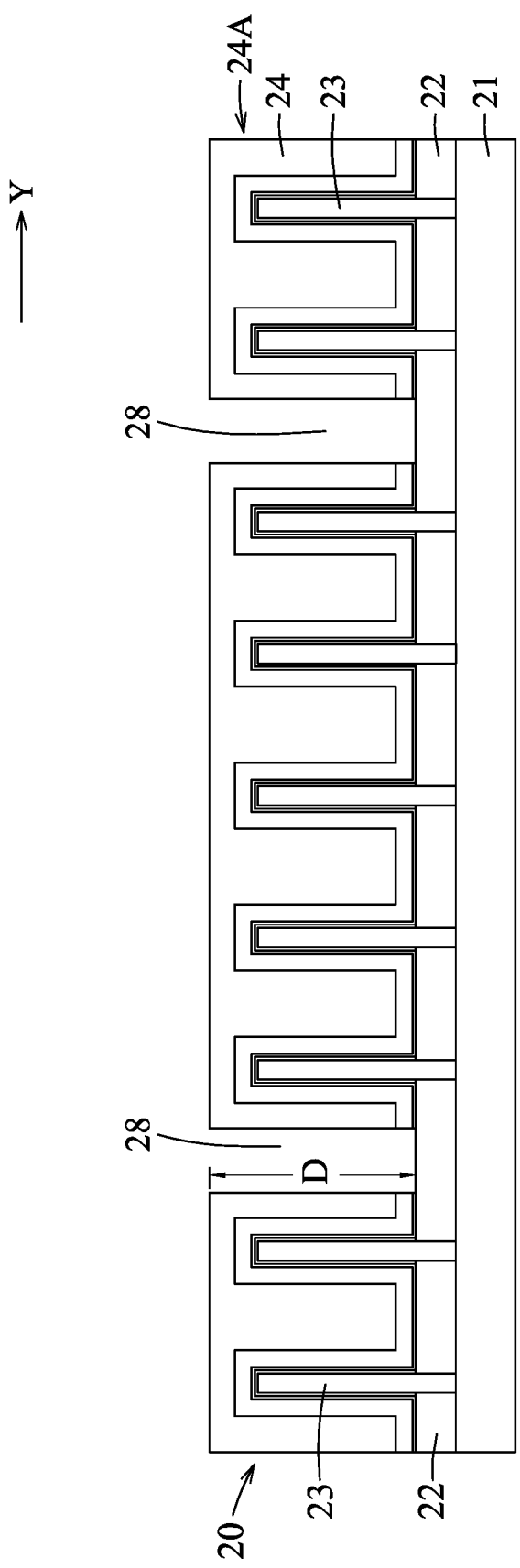
Figure 14:
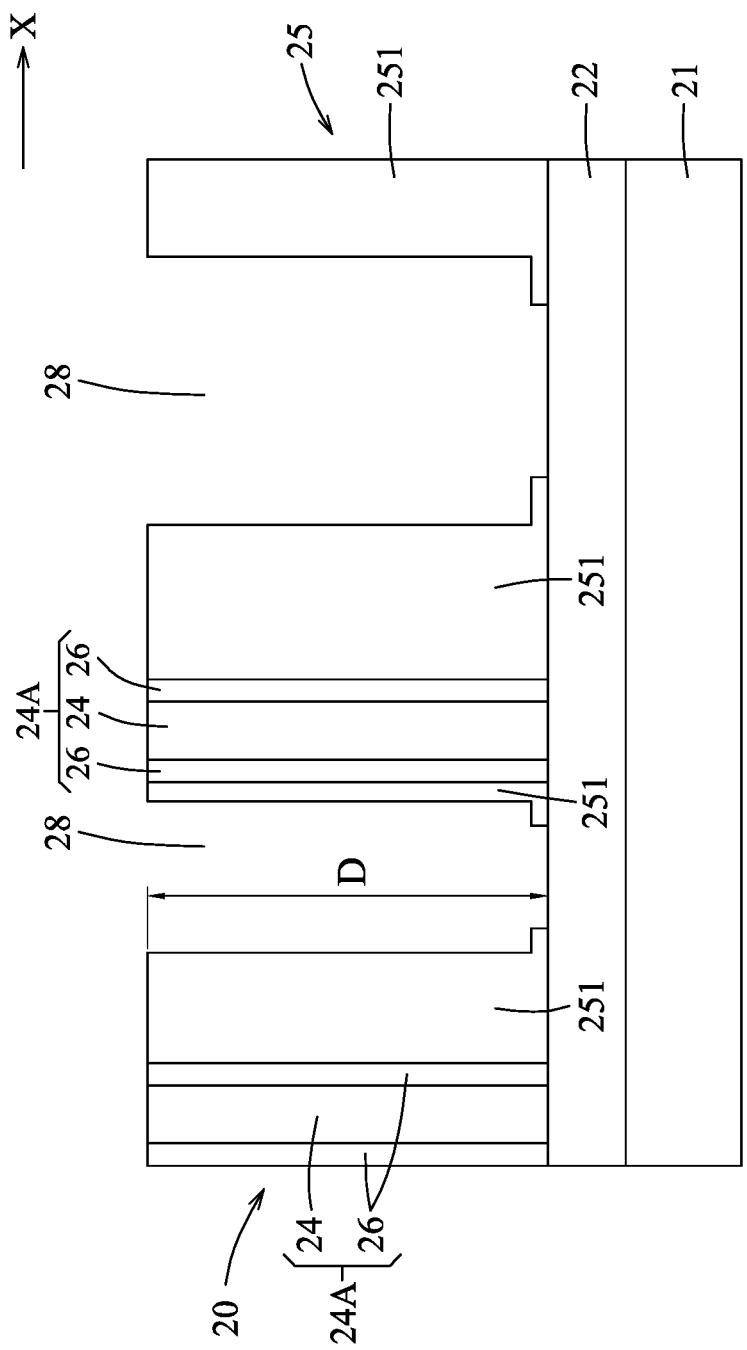

FIG. 12 is a schematic top view similar to FIG. 2 but illustrating that, after the formation of the trenches 28, the mask layer 27 shown in FIGS. 10 and 11 is removed. FIGS. 13 and 14 are respectively similar to FIGS. 10 and 11, but are cross-sectional views taken along line A-A in the Y direction and line B-B in the X direction of FIG. 12, respectively. This process is illustrated as process 208 in the flow chart 200 shown in FIG. 1. The mask layer 27 may be removed using, for example, dry etching, wet etching, CMP or other suitable techniques. In some embodiments, as shown in FIG. 12, a top view of each of the trenches 28 may be in a rectangular shape with four rounded corners, but other geometries for top edges of the trenches 28 are also within the scope of the disclosure. In some embodiments, each of the trenches 28 has a length (L) (as shown in FIG. 12) ranging from about 20 nm to about 30 nm, but other range values for the length (L) are also within the scope of the disclosure. In some embodiments, each of the trenches 28 has a width (W) (as shown in FIG. 12) ranging from about 10 nm to about 20 nm, but other range values are also within the scope of the disclosure. In some embodiments, each of the trenches 28 has a depth (D) (see FIGS. 13 and 14) ranging from about 100 nm to about 200 nm, but other range values for the depth (D) are also within the scope of the disclosure.

Figure 15:
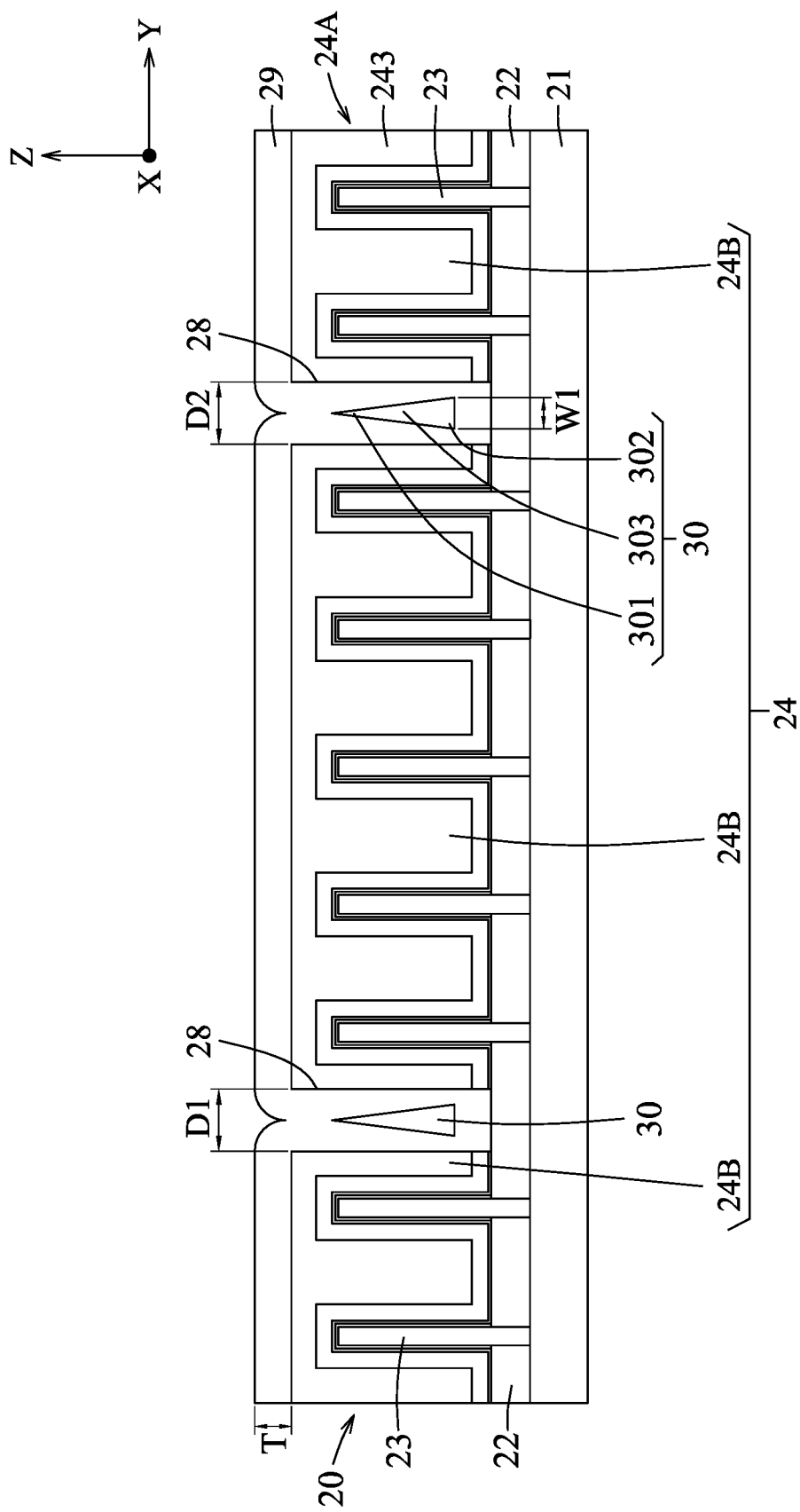
Figure 16:
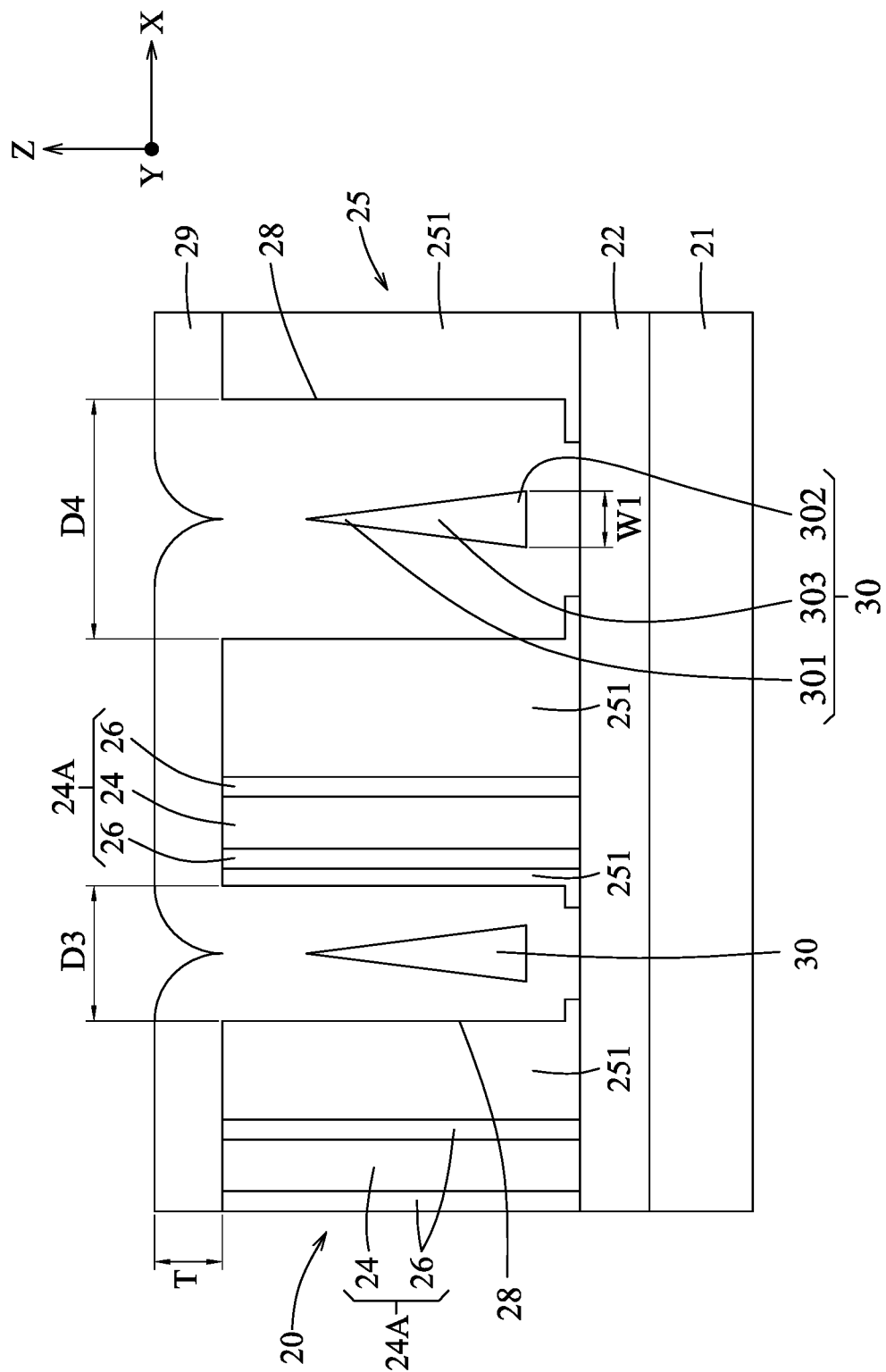

FIGS. 15 and 16 are similar to FIGS. 13 and 14, but illustrate that, after the removal of the mask layer 27, a refill dielectric layer 29 is formed on top surfaces of the gate structures 24A, top surfaces of the dielectric portions 251, and fills the trenches 28. This process is illustrated as process 210 in the flow chart 200 shown in FIG. 1. In some embodiments, the refill dielectric layer 29 may be made of an oxygen free dielectric material to alleviate oxidation of the gate stacks 24. In some embodiments, the refill dielectric layer 29 may be made of silicon mononitride (SiN), silicon carbon nitride (SiCN), silicon carbide (SiC), metal nitride, other suitable materials, or any combination thereof. In some embodiments, the refill dielectric layer 29 is formed using, for example, CVD, PVD or other suitable techniques. The refill dielectric layer 29 may have a thickness (T) in a Z direction on the gate structures 24A and the top surfaces of the dielectric portions 251, and dimensions (D1, D2) in the Y direction and dimensions (D3, D4) in the X direction in the trenches 28. The Z direction is normal to both the X and Y directions. The dimensions (D1, D2) correspond to the widths (W) of the trenches 28 in the Y direction (shown in FIG. 12). The dimensions (D3, D4) correspond to the lengths (L) of the trenches 28 in the X direction (shown in FIG. 12). In some embodiments, the thickness (T) is greater than one half of a maximum one of the dimensions (D1 to D4). In some embodiments, the refill dielectric layer 29 may fill the trenches 28 in a non-conformal manner, and an air gap 30 may thus be formed in the refill dielectric layer 29 in each trench 28. In some embodiments, the air gap 30 may occupy about 10% to about 90% of the volume of the corresponding trench 28. In some embodiments, the air gap 30 includes an upper gap portion 301, a lower gap portion 302 opposite to the upper gap portion 301 in the Z direction, and a middle gap portion 303 between the upper and lower gap portions 301, 302. In some embodiments, a width (W1) of the lower gap portion 302 in the X or Y direction is greater than that of the upper gap portion 301. In this process, the semiconductor structure 20 may be clamped by an electrostatic chuck (E-chuck). When process 210 in the flow chart 200 shown in FIG. 1 is performed, by rotating the S-chuck, the semiconductor structure 20 would undergo a rotation such that the refill dielectric layer 29 may non-conformally fill the trenches 28 so as to form the air gaps 30.

Figure 17:
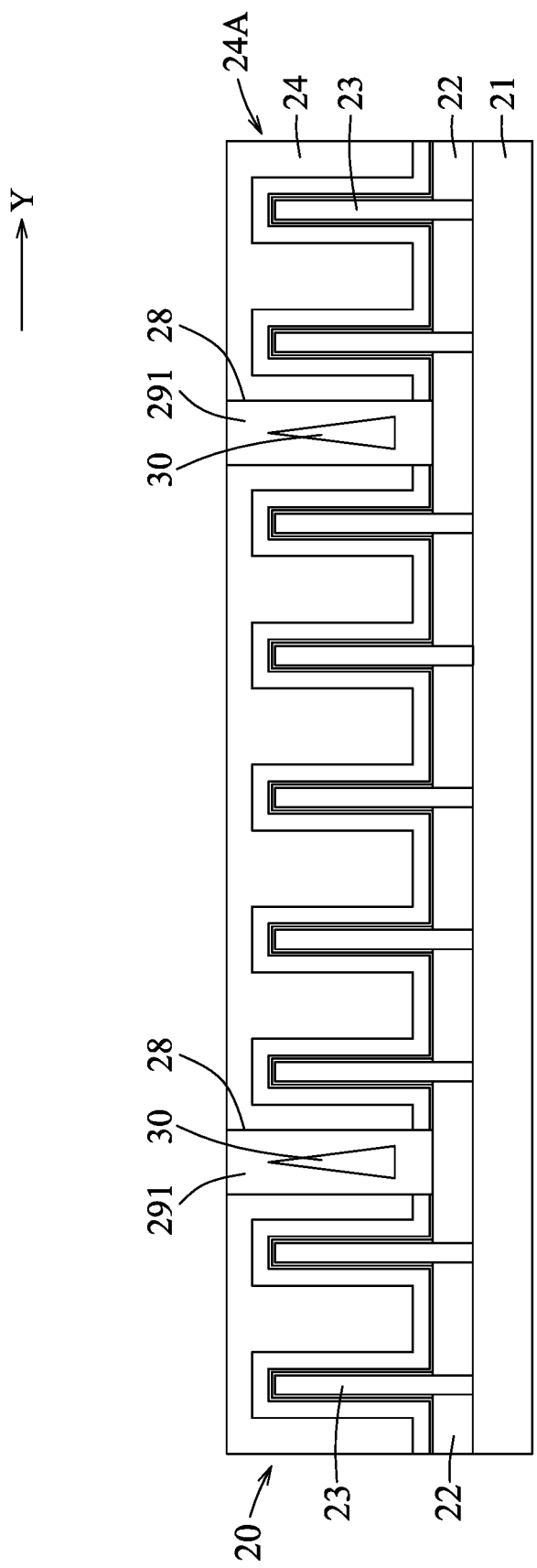
Figure 18:
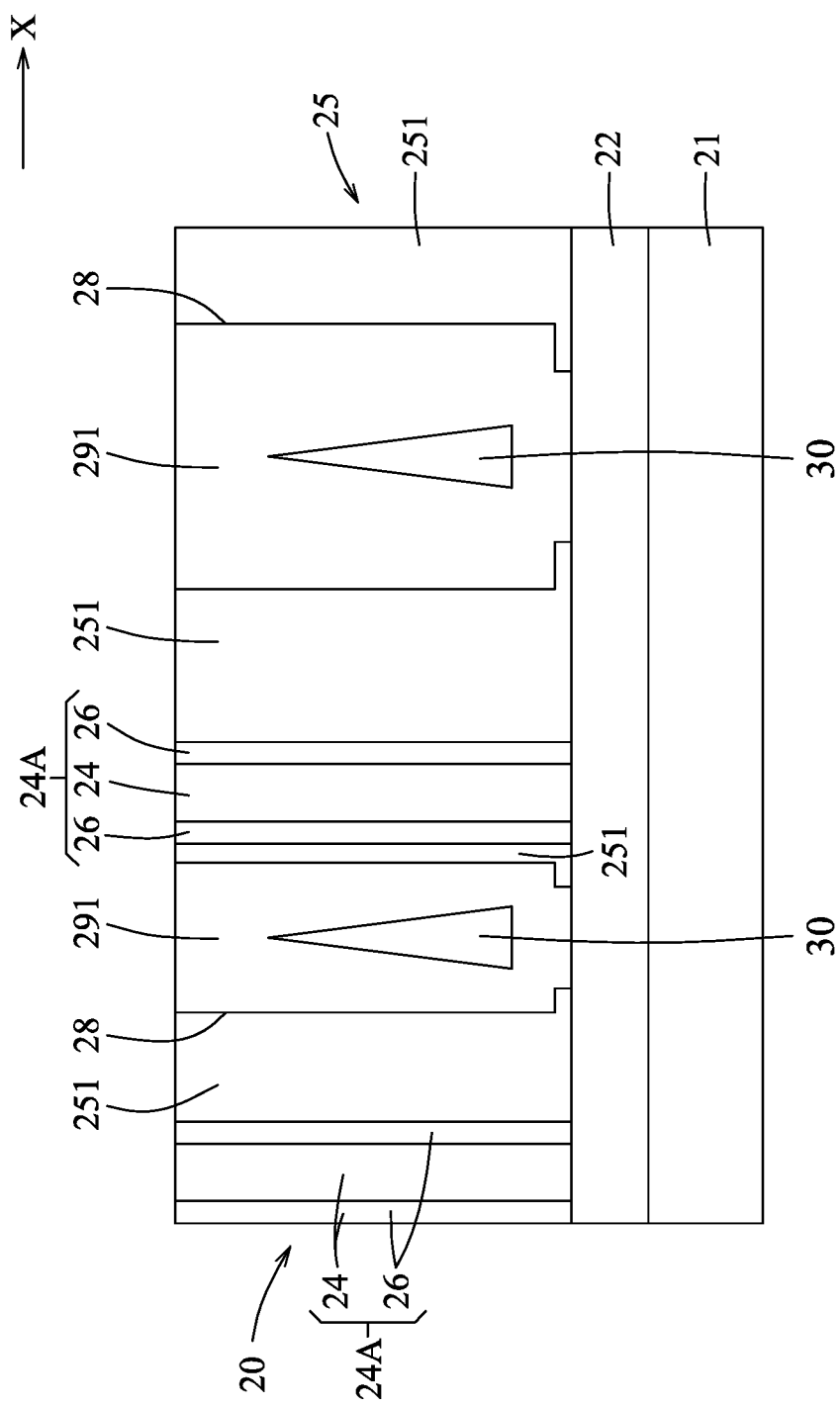

FIGS. 17 and 18 are similar to FIGS. 15 and 16, but illustrate that, after the formation of the refill dielectric layer 29, an excess of the refill dielectric layer 29 on the top surfaces of the gate structures 24A and the first dielectric layer 25 is removed to form refill isolations 291 respectively in the trenches 28. This process is illustrated as process 212 in the flow chart 200 shown in FIG. 1. In some embodiments, the refill dielectric layer 29 on the top surface of the gate structures 24A and the first dielectric layer 25 may be removed using, for example, CMP or other suitable techniques, without exposing the air gaps 30. In some embodiments, the refill isolations 291 may be in contact with the isolation regions 22.

Figure 19:
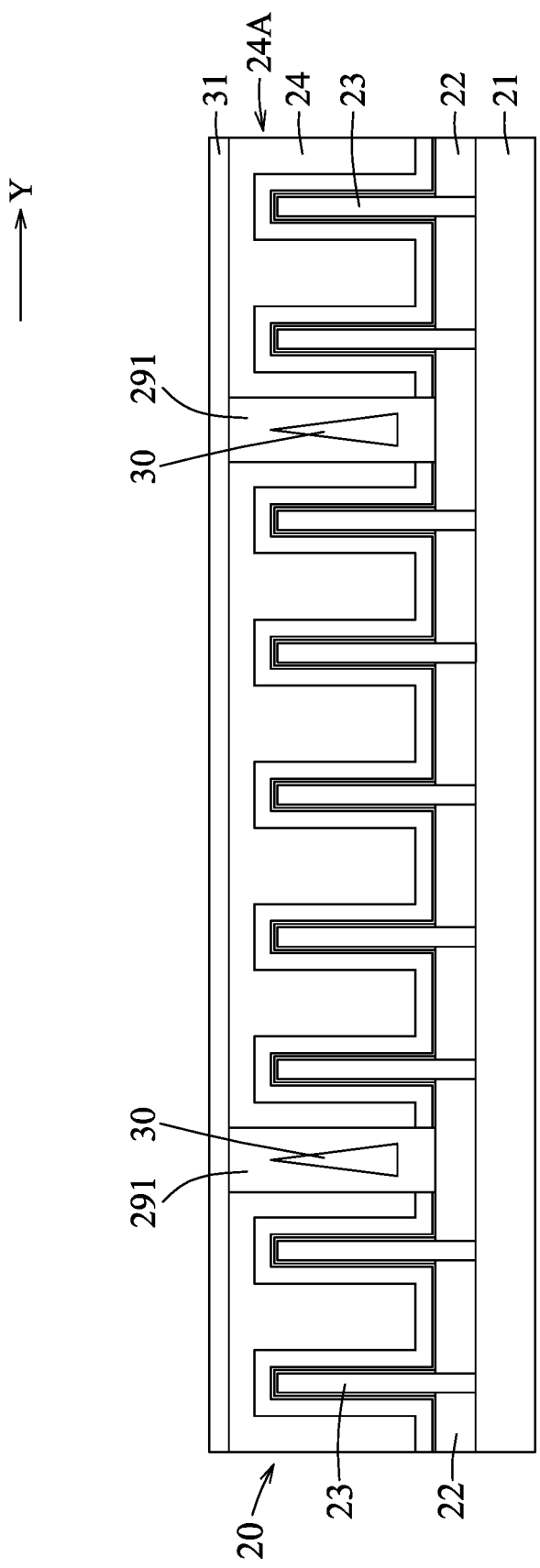
Figure 20:
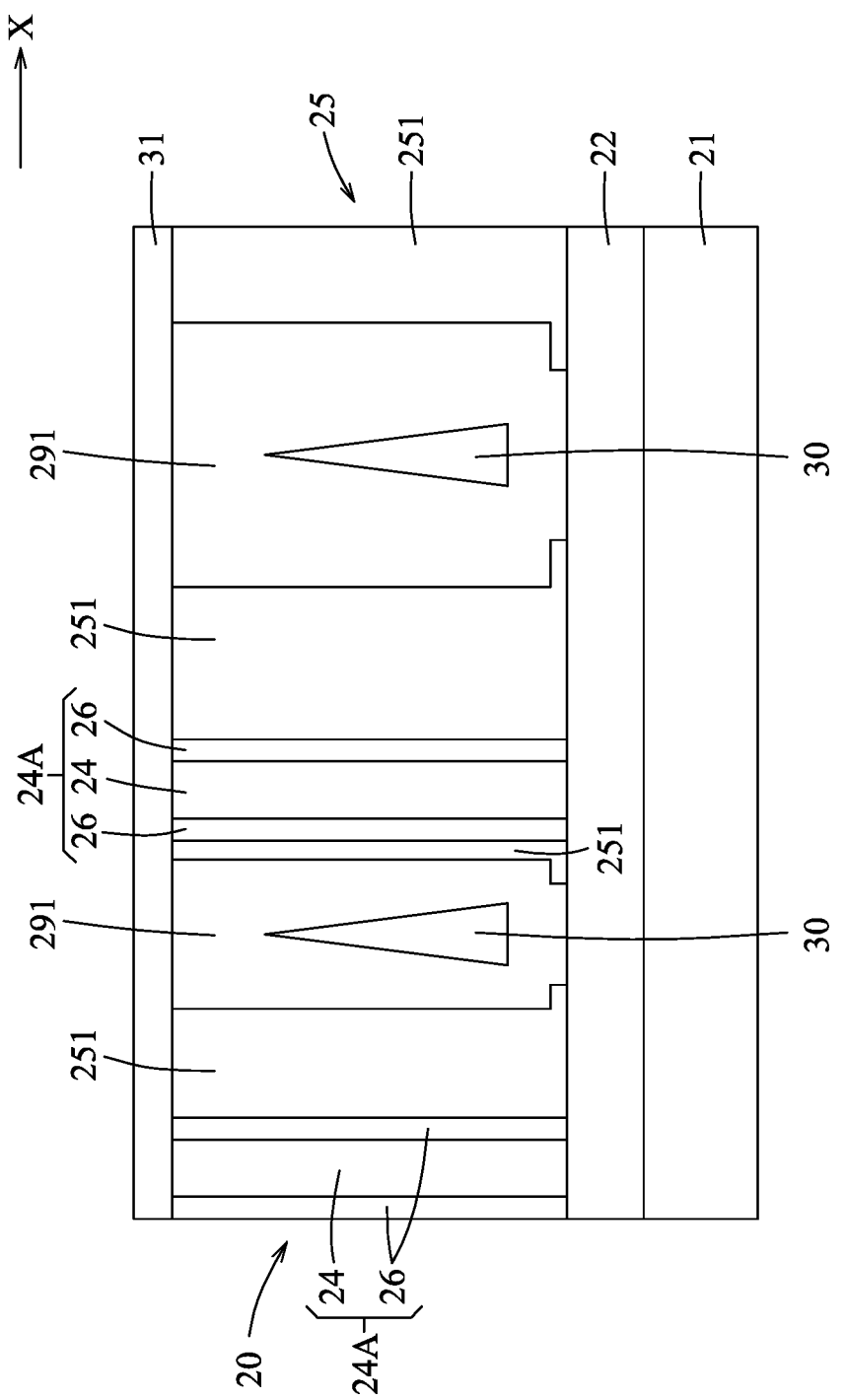

FIGS. 19 and 20 are similar to FIGS. 17 and 18, but illustrate that, after the removal of the excess of the refill dielectric layer 29, a first etch stop layer 31 is formed on the gate structures 24A, the first dielectric layer 25, and the refill isolations 291 using, for example, CVD or other suitable techniques. The first etch stop layer 31 may include, for example, metal nitride, metal oxide, metal carbide, silicon nitride, silicon oxide, silicon carbide, any combination thereof or other suitable materials. The first etch stop layer 31 may be formed using, for example, CVD, PECVD, ALD, spin-on coating, electroless plating or other suitable techniques.

Figure 21:
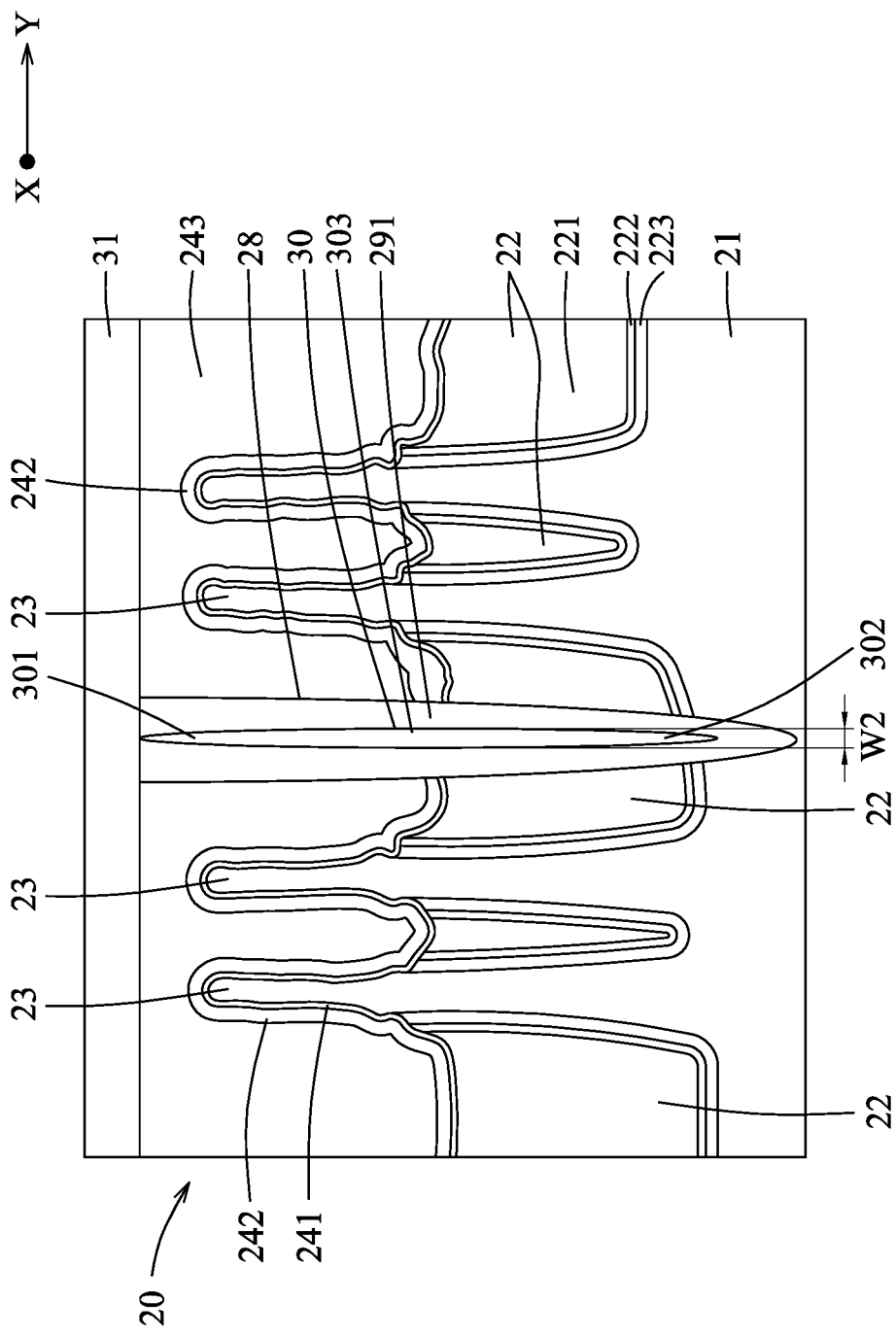

FIG. 21 illustrates a semiconductor structure 20 in accordance with some embodiments. FIG. 21 is similar to FIG. 19 but illustrates that the air gap 30 may be formed in an ellipse shape. In some embodiments, a width (W2) of the middle gap portion 303 in the X or Y direction is greater than that of each of the upper and lower gap portions 301, 302. In addition, each of the isolation regions 22 may include multiple dielectric layers 221, 222, 223, and the layer 222 may be a liner oxide layer 222 disposed between the dielectric layer 221 and a corresponding one of the semiconductor fins 23. In some embodiments, each trench 28 may extend downwardly through a corresponding isolation region 22 to terminate at the substrate 21, as shown in FIG. 21.

Figure 22:
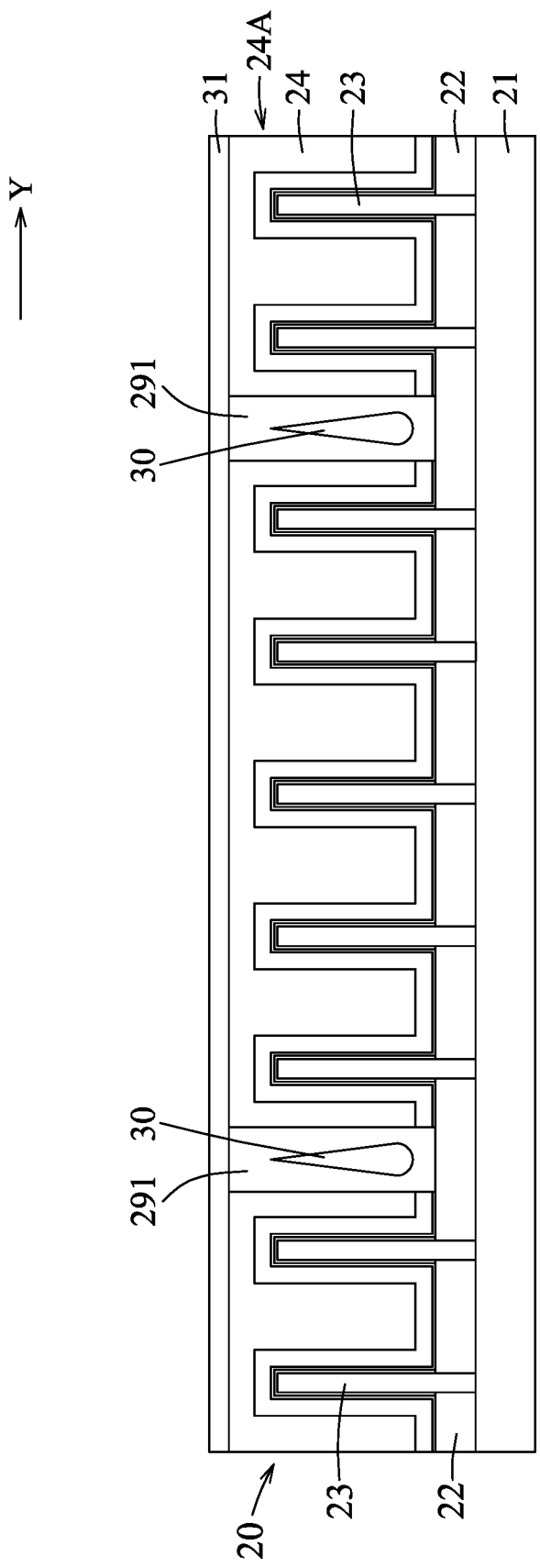

FIG. 22 illustrates a semiconductor structure 20 in accordance with some embodiments. FIG. 22 is similar to FIG. 19 but illustrates that each air gap 30 may be formed in a water drop shape.

Figure 23:
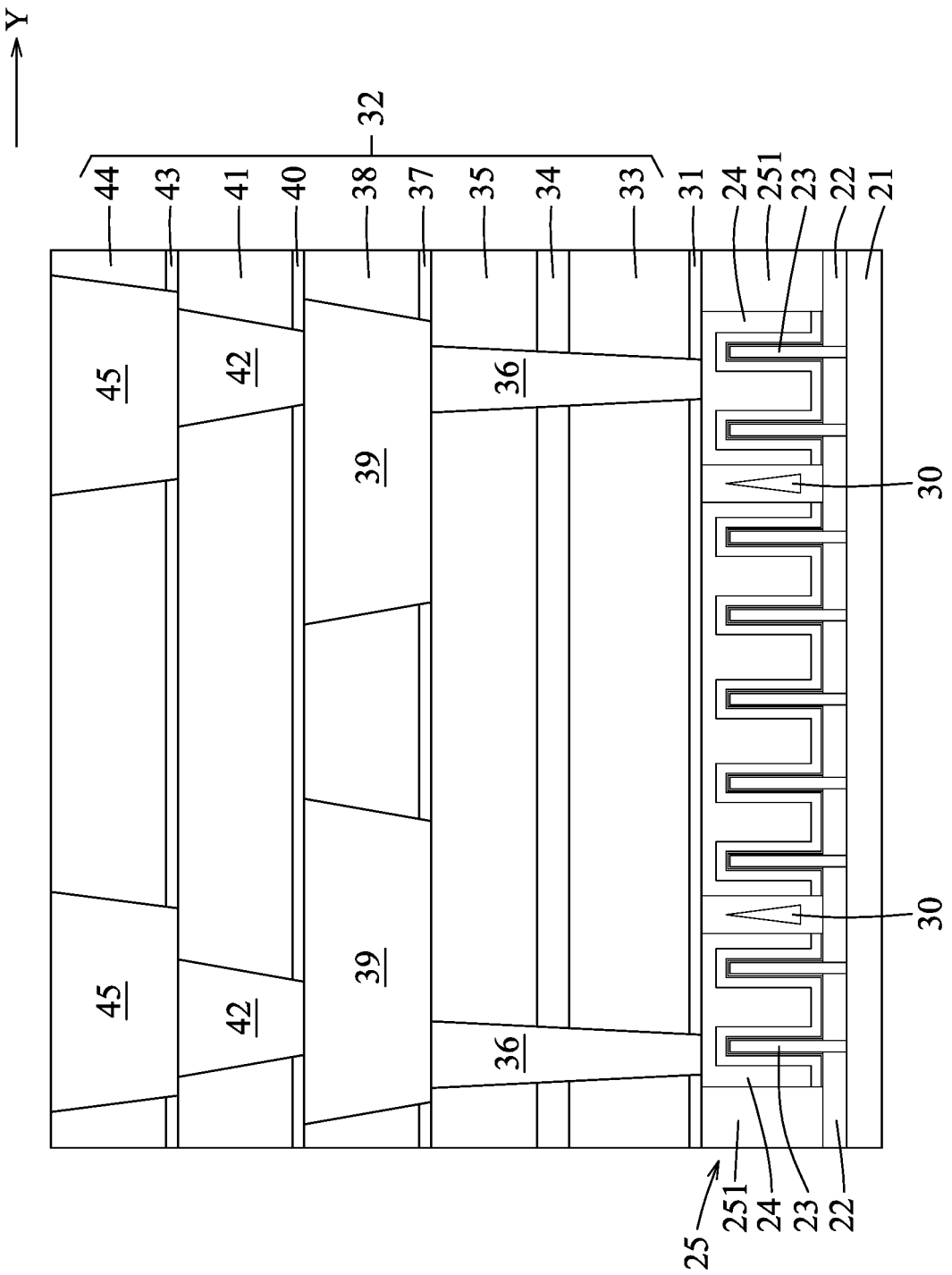

FIG. 23 illustrates that, after the formation of the first etch stop layer 31, an interconnect feature 32 is formed on the first etch stop layer 31 opposite to the substrate 21. This process is illustrated as process 214 in the flow chart 200 shown in FIG. 1. The interconnect feature 32 may include a second dielectric layer 33, a second etch stop layer 34, a third dielectric layer 35, via contacts 36, a third etch stop layer 37, a fourth dielectric layer 38, first metal contacts 39, a fourth etch stop layer 40, a fifth dielectric layer 41, second metal contacts 42, a fifth etch stop layer 43, a sixth dielectric layer 44, and third metal contacts 45. The process of forming the interconnect feature 32 is described as follows.

The second dielectric layer 33 is formed on the first etch stop layer 31 opposite to the substrate 21. The second dielectric layer 33 may include, for example, USG, PSG, BSG, BPSG, FSG, $SiO_2$, SiOC-based materials (e.g., SiOCH) or other suitable materials. The second dielectric layer 33 may be formed using, for example, spin-on coating, FCVD, PECVD, LPCVD, ALD or other suitable techniques. After the formation of the second dielectric layer 33, the second etch stop layer 34 is formed on the second dielectric layer 33 opposite to the first etch stop layer 31. The second etch stop layer 34 may include, for example, metal nitride, metal oxide, metal carbide, silicon nitride, silicon oxide, silicon carbide, any combination thereof or other suitable materials. The second etch stop layer 34 may be formed using, for example, CVD, PECVD, ALD, spin-on coating, electroless plating or other suitable techniques. After the formation of the second etch stop layer 34, the third dielectric layer 35 is formed on the second etch stop layer 34 opposite to the second dielectric layer 33. The third dielectric layer 35 may include, for example, USG, PSG, BSG, BPSG, FSG, $SiO_2$, SiOC-based materials (e.g., SiOCH) or other suitable materials. The third dielectric layer 35 may be formed using, for example, spin-on coating, FCVD, PECVD, LPCVD, ALD or other suitable techniques. After the formation of the third dielectric layer 35, the third dielectric layer 35, the second etch stop layer 34, the second dielectric layer 33, and the first etch stop layer 31 are etched to form a plurality of first openings (not shown). In some embodiments, the third dielectric layer 35, the second etch stop layer 34, the second dielectric layer 33, and the first etch stop layer 31 may be etched using, for example, dry etching (e.g., using plasma containing $H_2$, $N_2$, $NH_3$, $O_2$, CxFx or other suitable materials) or other suitable techniques, so as to form the first openings. After the formation of the first openings, the via contacts 36 are respectively formed in the first openings. The via contacts 36 are electrically connected to the gate stacks 24. The via contacts 36 may include, for example, cobalt, tungsten, copper, titanium, tantalum, aluminum, zirconium, hafnium, any combination thereof or other suitable materials. The via contacts 36 may be formed by filling the first openings using, for example, CVD, ALD, electroless plating or other suitable techniques, followed by a planarization process such as CMP or other suitable processes. The first etch stop layer 31 and the second etch stop layer 34 may respectively serve as an etch stop layer during formation of openings (not shown) in the second and third dielectric layers 33, 35. After formation of the via contacts 36, the third etch stop layer 37 is formed on the third dielectric layer 35 and the via contacts 36. The third etch stop layer 37 may include, for example, metal nitride, metal oxide, metal carbide, silicon nitride, silicon oxide, silicon carbide, any combination thereof or other suitable materials. The third etch stop layer 37 may be formed using, for example, CVD, PECVD, ALD, spin-on coating, electroless plating or other suitable techniques. After the formation of the third etch stop layer 37, the fourth dielectric layer 38 is formed on the third etch stop layer 37 opposite to the third dielectric layer 35. The fourth dielectric layer 38 may include, for example, silicon oxide, silicon nitride, silicon carbide, silicon oxycarbide, silicon oxynitride, silicon carbonitride, silicon oxycarbonitride, any combination thereof or other suitable materials. The fourth dielectric layer 38 may be formed using, for example, spin-on coating, FCVD, PECVD, LPCVD, ALD or other suitable techniques. After the formation of the fourth dielectric layer 38, the fourth dielectric layer 38 and the third etch stop layer 37 are etched to form a plurality of second openings (not shown). In some embodiments, the fourth dielectric layer 38 and the third etch stop layer 37 may be etched using, for example, dry etching (e.g., using plasma containing $H_2$, $N_2$, $NH_3$, $O_2$, CxFx or other suitable gases) or other suitable techniques, so as to form the second openings. After the formation of the second openings, the first metal contacts 39 are respectively formed in the second openings. The first metal contacts 39 are electrically connected to the via contacts 36, respectively. The first metal contacts 39 may include, for example, copper, aluminum, tungsten, cobalt, ruthenium, molybdenum, silver, gold, any combination thereof, or other suitable materials. The first metal contacts 39 may be formed by filling the second openings using, for example, PVD, CVD, electroless plating, electroplating or other suitable techniques, followed by a planarization process such as CMP or other suitable processes. After the formation of the first metal contacts 39, the fourth etch stop layer 40 is formed on the fourth dielectric layer 38 and the first metal contacts 39. The fourth etch stop layer 40 may include, for example, metal nitride, metal oxide, metal carbide, silicon nitride, silicon oxide, silicon carbide, any combination thereof or other suitable materials. The fourth etch stop layer 40 may be formed using, for example, CVD, PECVD, ALD, spin-on coating, electroless plating or other suitable techniques. After the formation of the fourth etch stop layer 40, the fifth dielectric layer 41 is formed on the fourth etch stop layer 40 opposite to the fourth dielectric layer 38. The fifth dielectric layer 41 may include, for example, silicon oxide, silicon nitride, silicon carbide, silicon oxycarbide, silicon oxynitride, silicon carbonitride, silicon oxycarbonitride, any combination thereof or other suitable materials. The fifth dielectric layer 41 may be formed using, for example, spin-on coating, FCVD, PECVD, LPCVD, ALD or other suitable techniques. After the formation of the fifth dielectric layer 41, the fifth dielectric layer 41 and the fourth etch stop layer 40 are etched to form a plurality of third openings (not shown). In some embodiments, the fifth dielectric layer 41 and the fourth etch stop layer 40 may be etched using, for example, dry etching (e.g., using plasma containing $H_2$, $N_2$, $NH_3$, $O_2$, CxFx or other suitable gases) or other suitable techniques, so as to form the third openings. After the formation of the third openings, the second metal contacts 42 are respectively formed in the third openings. The second metal contacts 42 are electrically connected to the first metal contacts 39, respectively. The second metal contacts 42 may include, for example, copper, aluminum, tungsten, cobalt, ruthenium, molybdenum, silver, gold, any combination thereof or other suitable materials. The second metal contacts 42 may be formed by filling the third openings using, for example, PVD, CVD, electroless plating, electroplating or other suitable techniques, followed by a planarization process such as CMP or other suitable processes. After the formation of the second metal contacts 42, the fifth etch stop layer 43 is formed on the fifth dielectric layer 41 and the second metal contacts 42. The fifth etch stop layer 43 may include, for example, metal nitride, metal oxide, metal carbide, silicon nitride, silicon oxide, silicon carbide, any combination thereof or other suitable materials. The fifth etch stop layer 43 may be formed using, for example, CVD, PECVD, ALD, spin-on coating, electroless plating or other suitable techniques. After the formation of the fifth etch stop layer 43, the sixth dielectric layer 44 is formed on the fifth etch stop layer 43 opposite to the fifth dielectric layer 41. The sixth dielectric layer 44 may include, for example, silicon oxide, silicon nitride, silicon carbide, silicon oxycarbide, silicon oxynitride, silicon carbonitride, silicon oxycarbonitride, any combination thereof or other suitable materials. The sixth dielectric layer 44 may be formed using, for example, spin-on coating, FCVD, PECVD, LPCVD, ALD or other suitable techniques. After the formation of the sixth dielectric layer 44, the sixth dielectric layer 44 and the fifth etch stop layer 43 are etched to form a plurality of fourth openings (not shown). In some embodiments, the sixth dielectric layer 44 and the fifth etch stop layer 43 may be etched using, for example, dry etching (e.g., using plasma containing $H_2$, $N_2$, $NH_3$, $O_2$, CxFx or other suitable gases) or other suitable techniques, so as to form the fourth openings. After the formation of the fourth openings, the third metal contacts 45 are respectively formed in the fourth openings to obtain the interconnect feature 32. The third metal contacts 45 are electrically connected to the second metal contacts 42, respectively. The third metal contacts 45 may include, for example, copper, aluminum, tungsten, cobalt, ruthenium, molybdenum, silver, gold, combinations thereof or other suitable materials. The third metal contacts 45 may be formed by filling the fourth openings using, for example, PVD, CVD, electroless plating, electroplating or other suitable techniques, followed by a planarization process such as CMP or other suitable processes.

Figure 24:
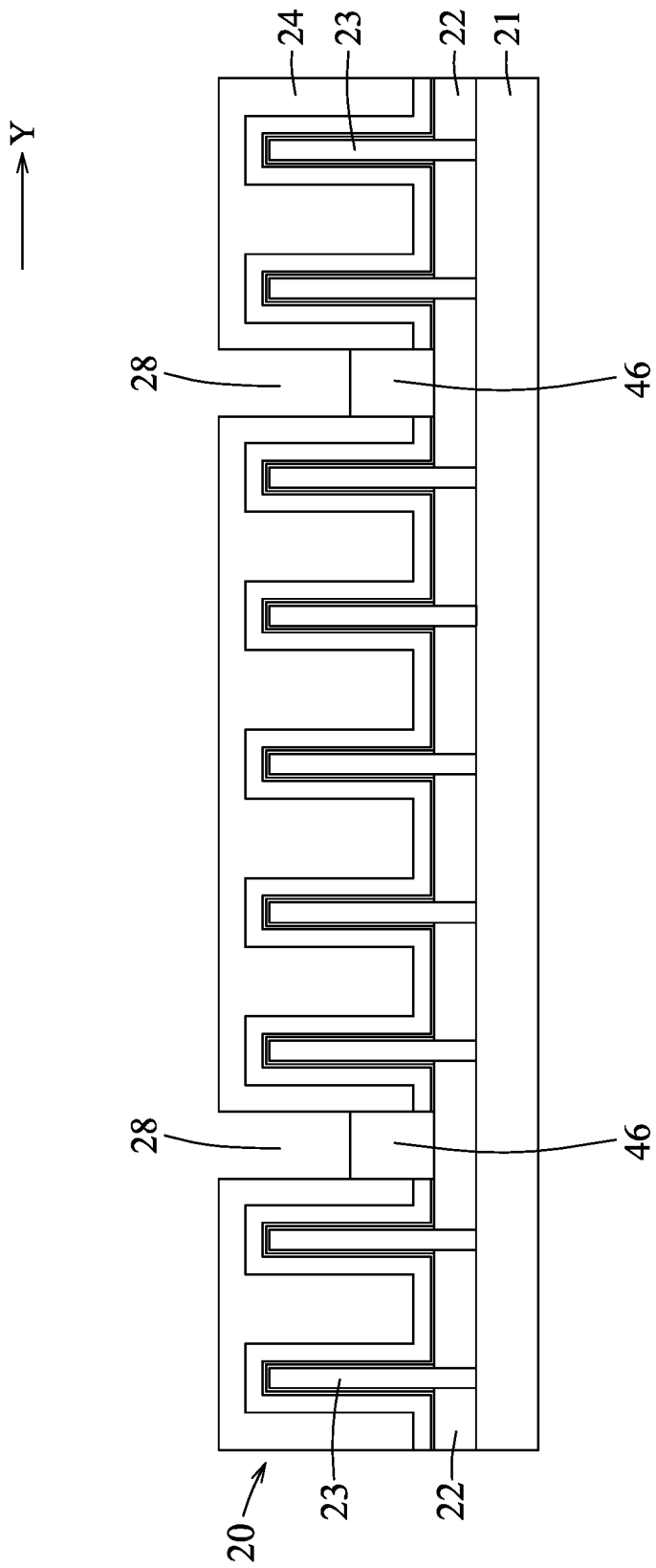
Figure 25:
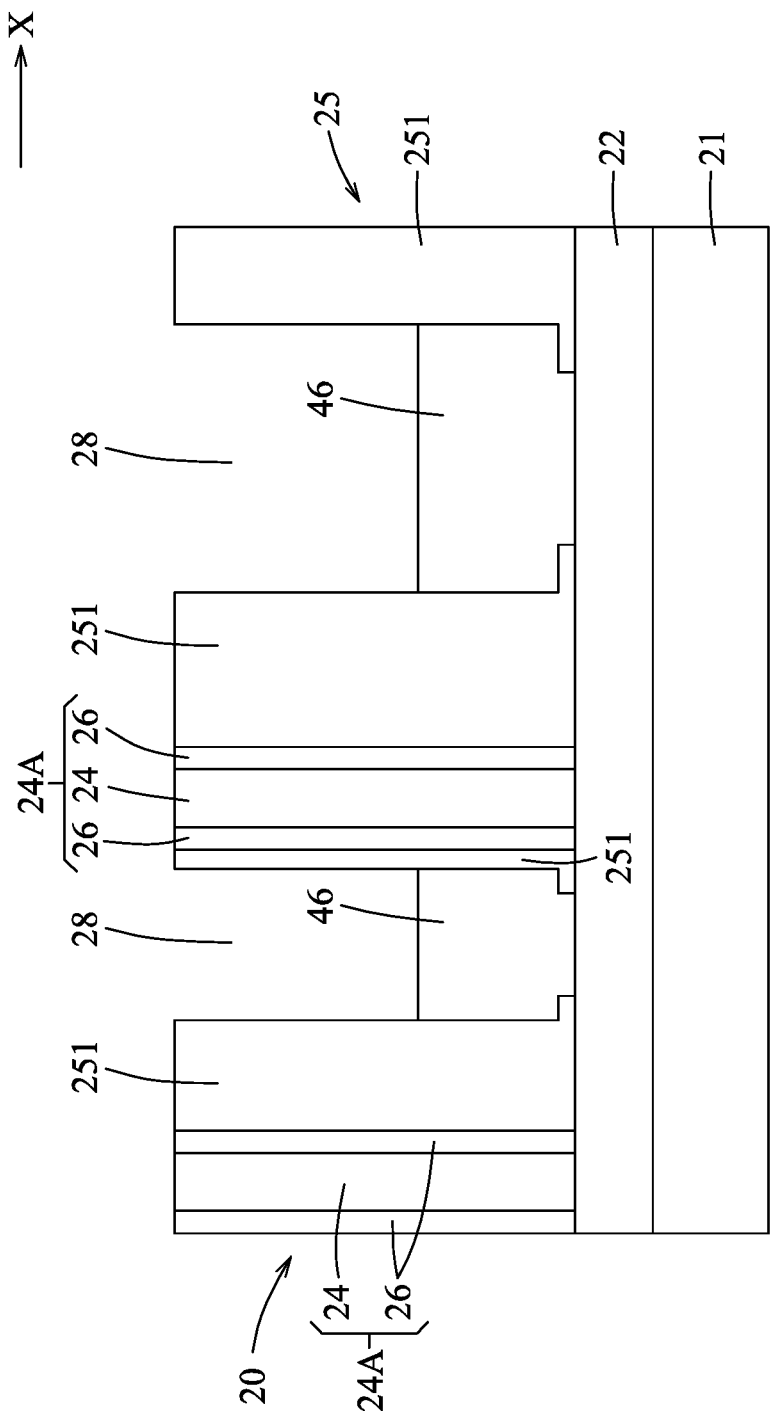

FIGS. 24 and 25 are similar to FIGS. 13 and 14, respectively, but illustrate that, in some embodiments, after the mask layer 27 is removed (i.e., process 208 in the flow chart 200 shown in FIG. 1), with respect to each trench 28, a sacrificial layer 46 may be formed to partially fill the trench 28. The sacrificial layer 46 may include, but not limited to, polyurea-containing material, acrylate-containing material, carboxylate-containing material, other thermal degradable materials, other ultraviolet (UV) degradable materials, combinations thereof or other suitable materials. The sacrificial layer 46 may be formed using, for example, ALD, CVD, molecular layer deposition (MLD), spin-on coating or other suitable techniques.

Figure 26:
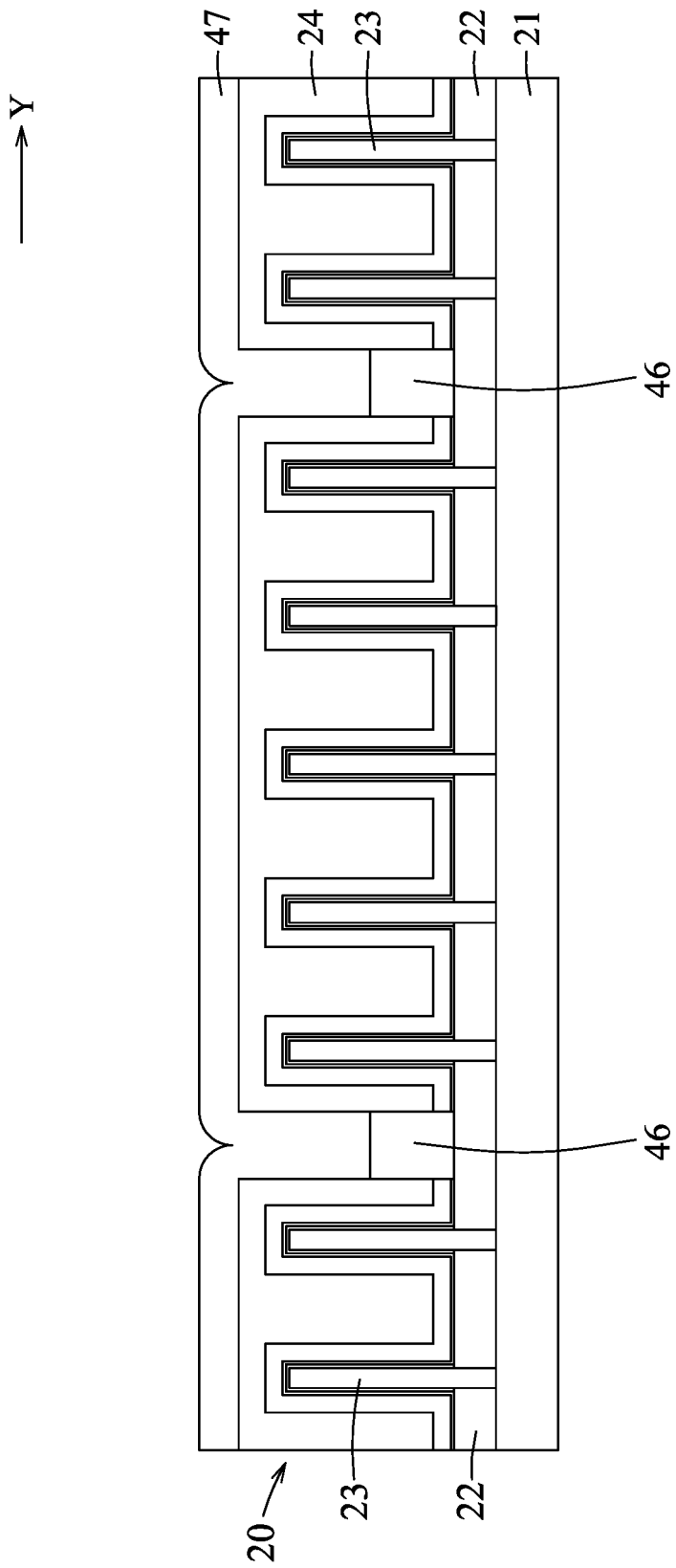
Figure 27:
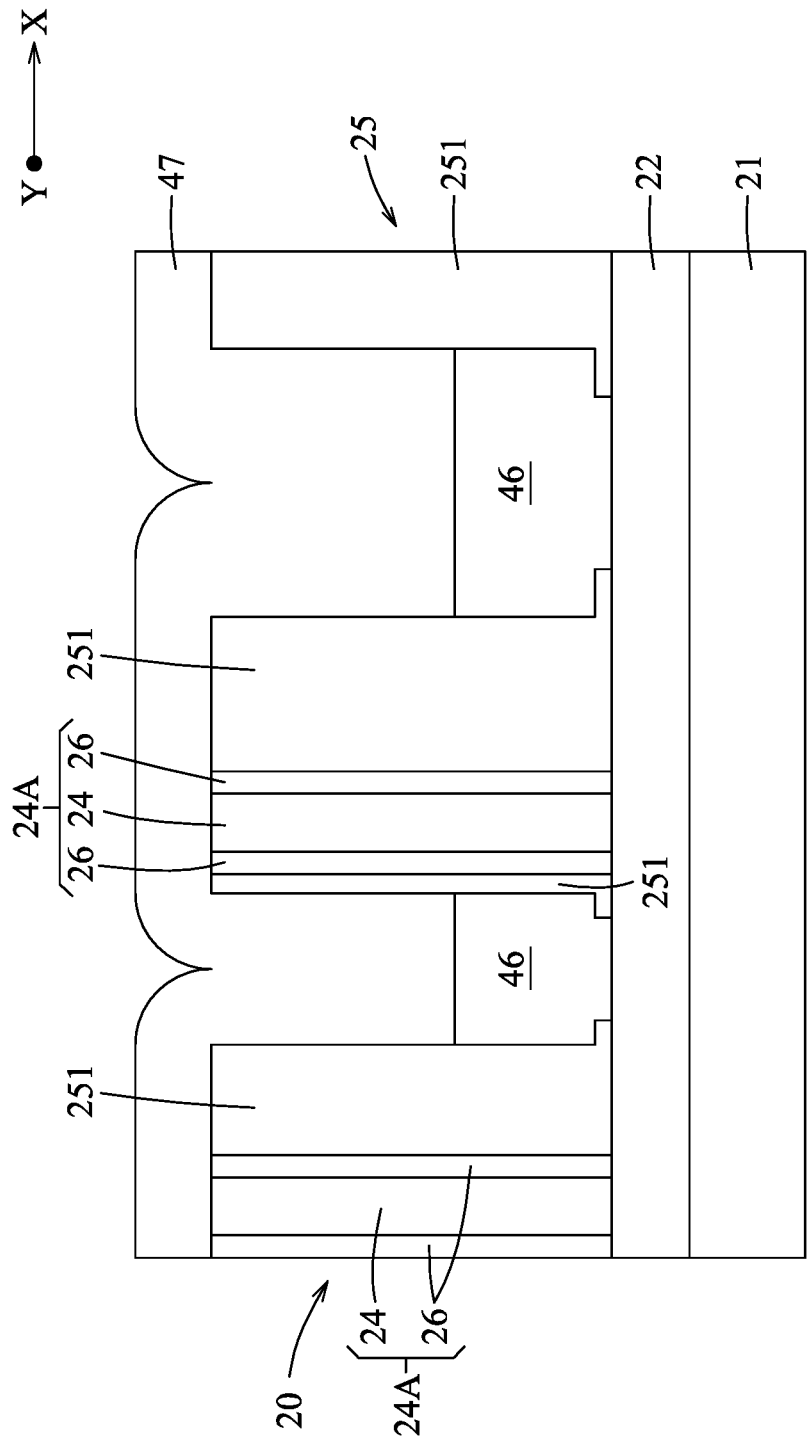

FIGS. 26 and 27 are similar to FIGS. 24 and 25, respectively, but illustrate that, after the formation of the sacrificial layers 46 in the trenches 28 (see FIGS. 24 and 25), a porous dielectric layer 47 is formed on the sacrificial layers 46 to fill the trenches 28. The porous dielectric layer 47 may be formed using, for example, CVD, PVD or other suitable techniques.

Figure 28:
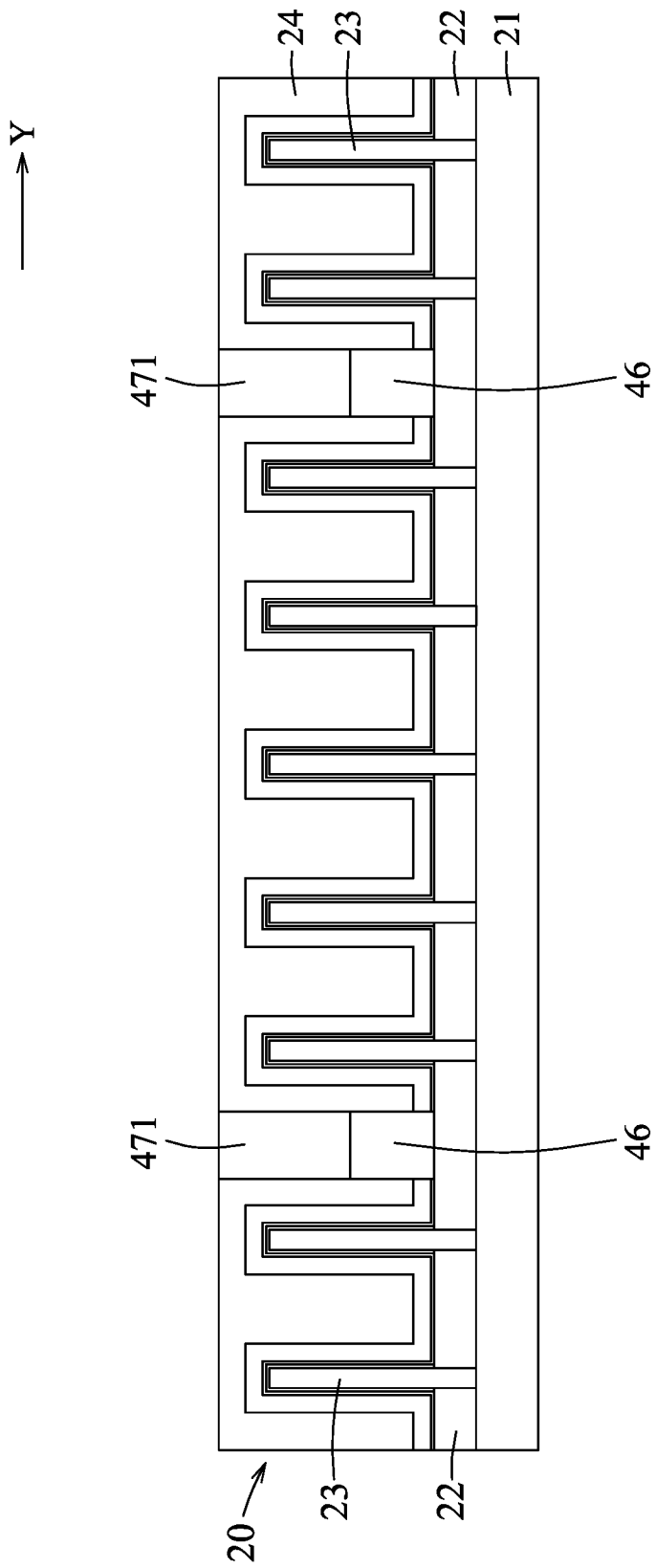
Figure 29:
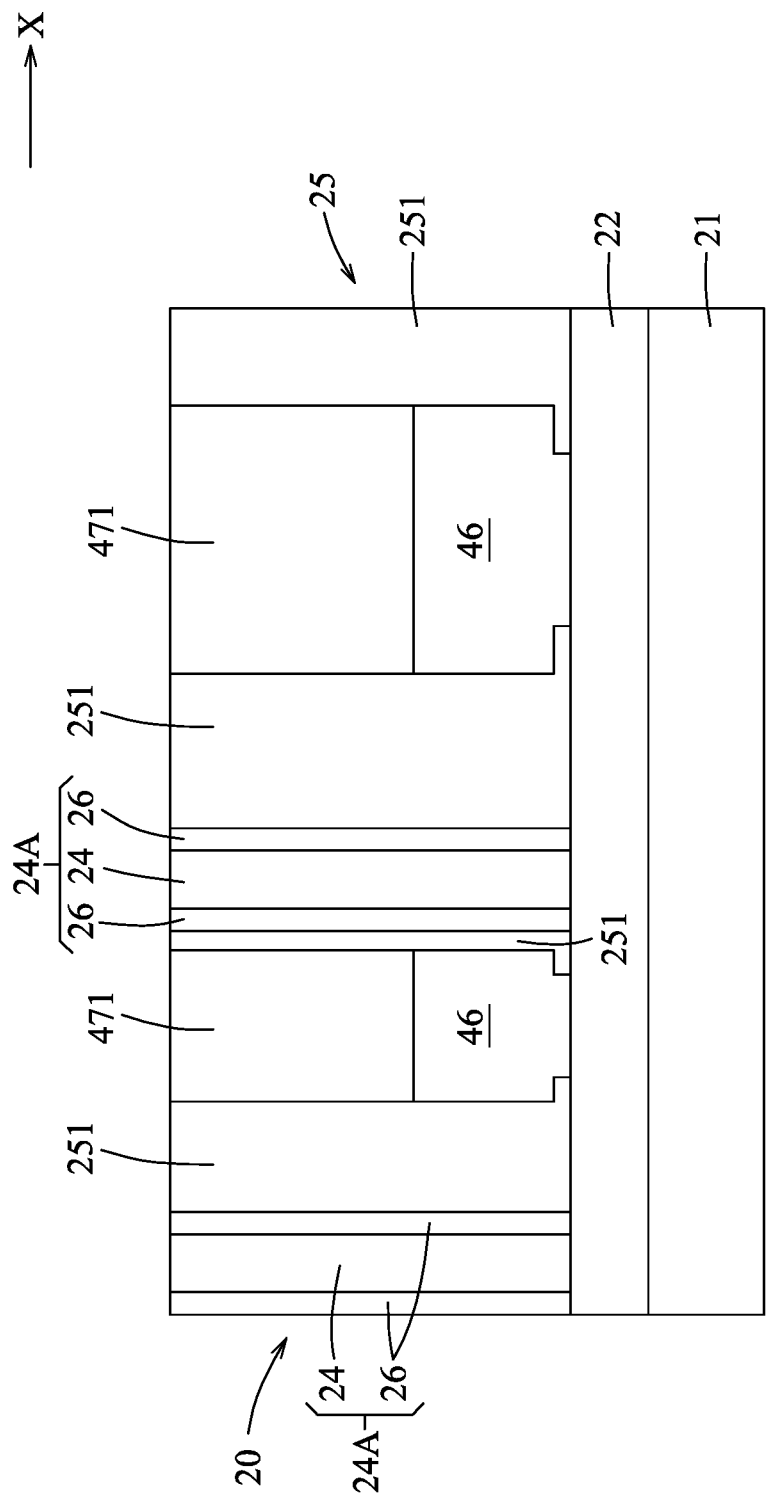

FIGS. 28 and 29 are similar to FIGS. 26 and 27, respectively, but illustrate that, after the formation of the porous dielectric layer 47, an excess of the porous dielectric layer 47 on the top surface of the gate stacks 24 and the first dielectric layer 25 is removed and thus porous dielectric portions 471 are formed to respectively cover the sacrificial layers 46 in the trenches 28 (see FIGS. 24 and 25). The excess of the porous dielectric layer 47 may be removed by a suitable technique, such as CMP or other suitable techniques.

Figure 30:
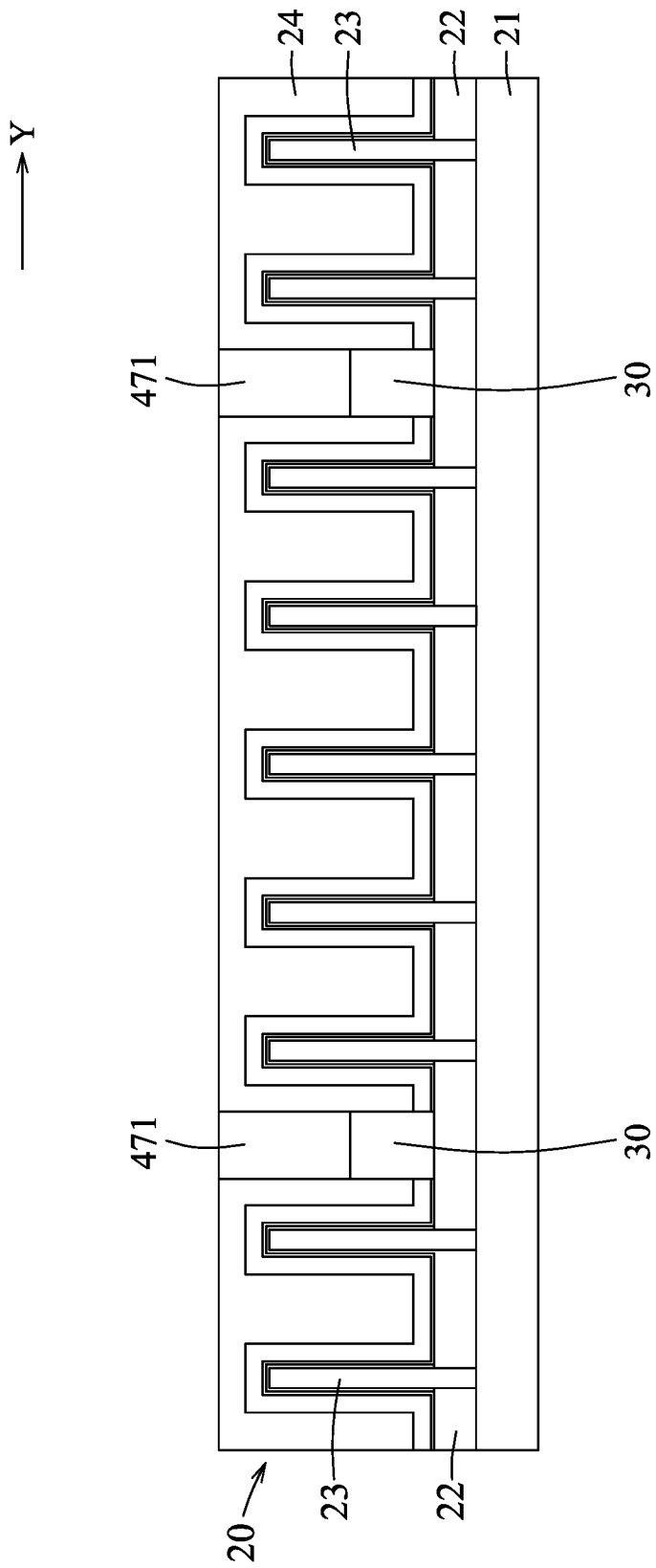
Figure 31:
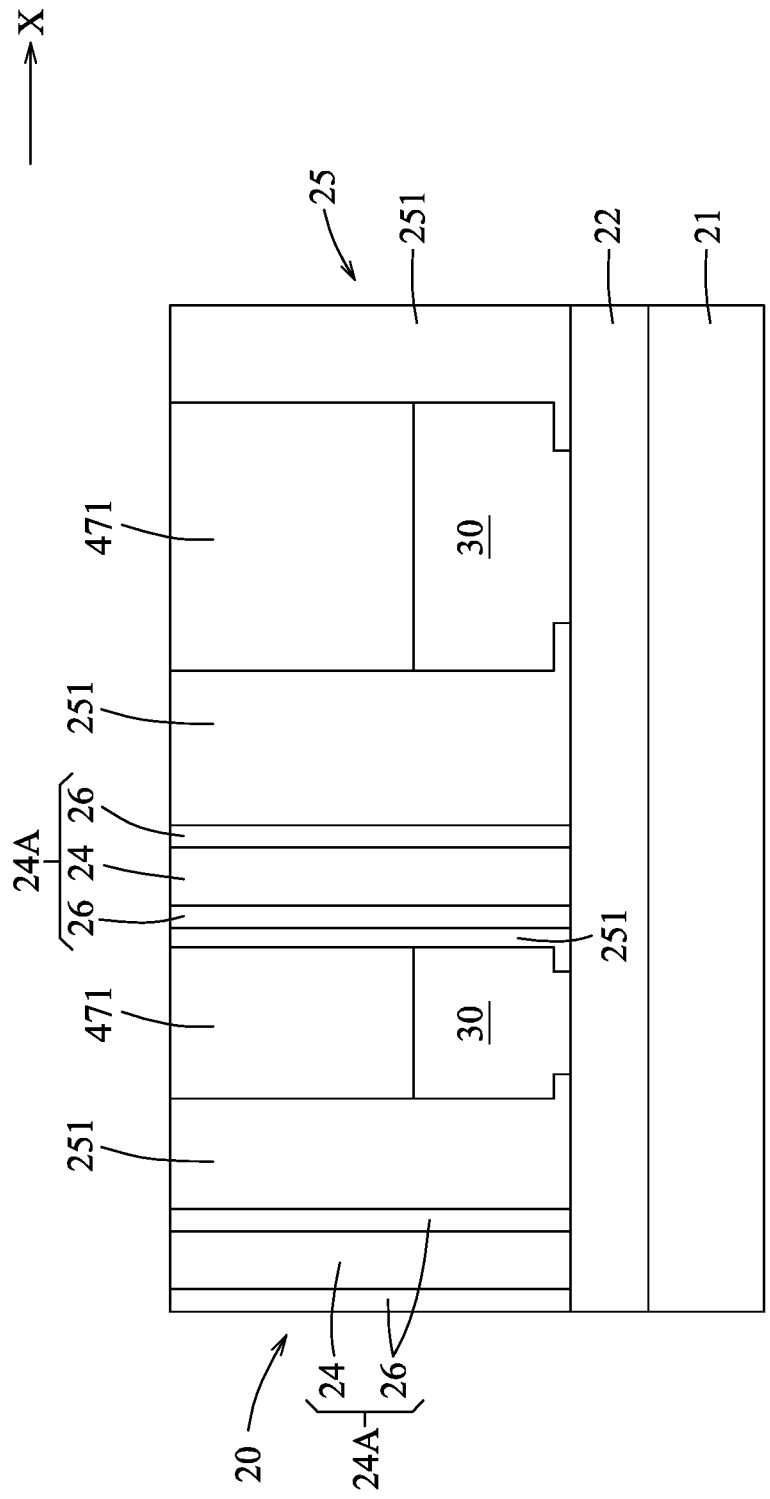

FIGS. 30 and 31 are similar to FIGS. 28 and 29, respectively, but illustrate that, after the removal of the excess of the porous dielectric layer 47 (see FIGS. 26 and 27), the sacrificial layers 46 shown in FIGS. 28 and 29 are removed, so as to obtain the air gaps 30. The sacrificial layers 46 may be removed by diffusing materials of the sacrificial layers 46 through porous structures formed in the porous dielectric portions 471. The sacrificial layers 46 may be removed by a thermal treatment, an UV treatment, other suitable techniques, or combinations thereof. Afterwards, process 214 as shown in FIG. 1 can be performed. In some embodiments, the porous dielectric layer 47 may serve as a refill isolation and the air gap 30 is formed beneath such refill isolation.

Figure 32:
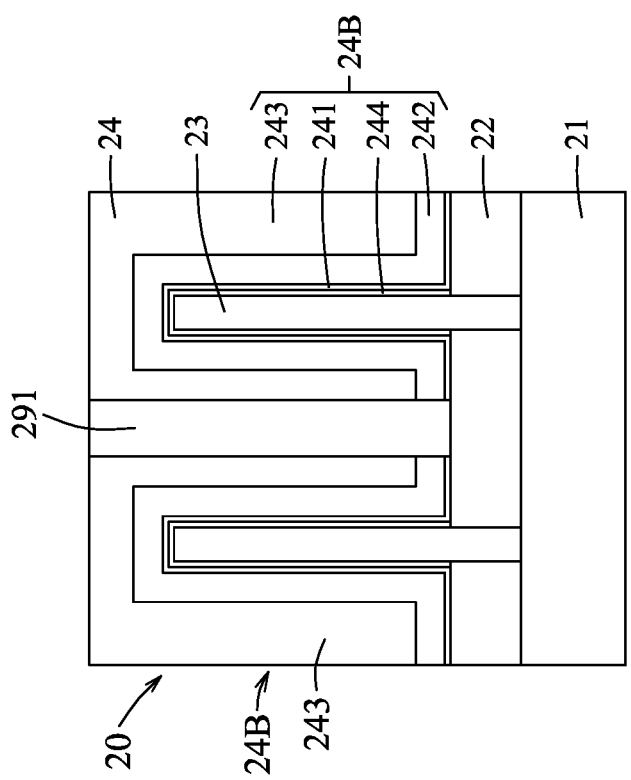
FIG. 32 illustrates a schematic view of a semiconductor structure in accordance with some embodiments.

FIG. 32 illustrates a semiconductor structure 20 in accordance with some embodiment, and is similar to a portion of FIG. 17 but no air gap is formed in the refill isolation 291. The refill isolation 291 partitions a gate stack 24 into two stack sections 24B.

Figure 33:
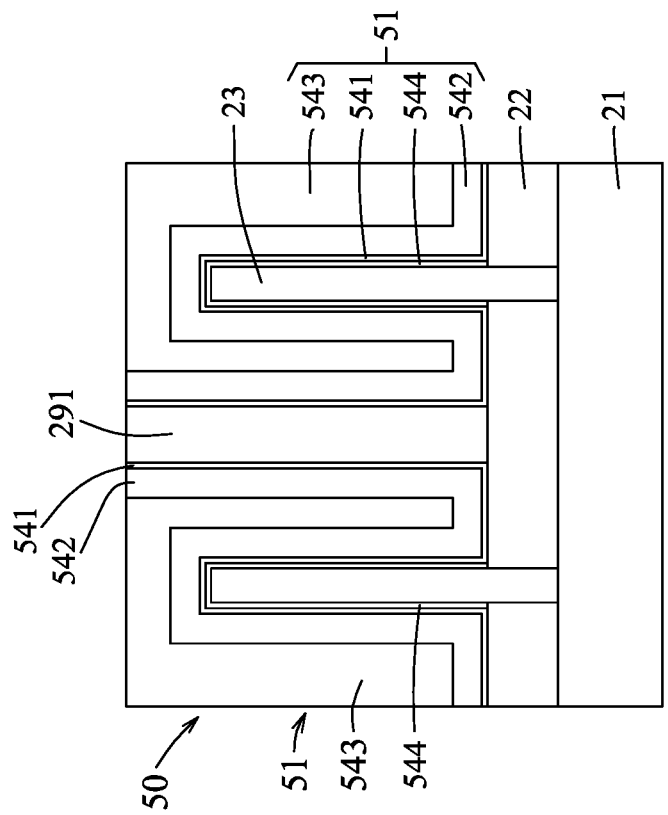
FIG. 33 illustrates a schematic view of a semiconductor structure in accordance with some embodiments.

FIG. 33 is similar to FIG. 32 but illustrates that after the refill isolation 291 is formed, a gate replacement process may be used to obtain a semiconductor structure 50. The gate replacement process may include (i) removing dummy gate stacks (not shown, which may include polysilicon), (ii) depositing materials for forming an interfacial layer on each of the semiconductor fins 23, (iii) sequentially and conformally depositing materials for forming a high-k dielectric layer, a work function metal layer and a metal fill layer, and (iv) conducting a planarization process, such as CMP or other suitable techniques, to obtain replaced stack sections 51 (two of which are shown in FIG. 33) each including an interfacial layer 544, a high-k dielectric layer 541, a work function metal layer 542 and a metal fill layer 543. The materials and techniques for forming the elements 541 to 544 are similar to those for the elements 241 to 244 described above, and the details thereof are omitted for the sake of brevity. As shown in FIG. 33, it is noted that two adjacent metal fill layers 543 of the replaced stack sections 51 are separated from each other by the refill isolation 291, the high-k dielectric layers 541 of the replaced stack sections 51, and the work function metal layers 542 of the replaced stack sections 51. Nevertheless, referring to FIG. 32, in the semiconductor structure 20 (see FIGS. 5 and 15) made by the method of the flow chart 200 shown in FIG. 1, the metal fill layers 243 of two adjacent stack sections 24B are only separated from one another by the refill isolation 291, thereby decreasing the distance between the metal fill layers 243 of the two adjacent stack sections 24B and further reducing the overall device dimension, as compared with the semiconductor structure 50.

In this disclosure, by non-conformally forming a refill dielectric layer in CMG trenches using an oxygen free dielectric material (which may have a high dielectric constant), the refill dielectric portions obtained from the refill dielectric layer can not only prevent oxidation of the gate stacks, but also have the air gaps therein which are useful for reducing overall dielectric constant of a resulting device. Therefore, the overall capacitance of the semiconductor device may be lowered by, for example, about 1% to about 2%.

In accordance with some embodiments, a semiconductor device includes a plurality of semiconductor fins, at least one gate stack, a refill isolation, and an air gap. Each of the semiconductor fins extends in an X direction. Two adjacent ones of the semiconductor fins are spaced apart from each other in a Y direction transverse to the X direction. The at least one gate stack has two stack sections spaced apart from each other in the Y direction. The stack sections are disposed over two adjacent ones of the semiconductor fins, respectively. The refill isolation and the air gap are disposed between the stack sections.

In accordance with some embodiments, the semiconductor device further includes a semiconductor substrate and an isolation structure. The semiconductor fins are formed on the semiconductor substrate. The isolation structure is disposed on the semiconductor substrate among lower portions of the semiconductor fins. The gate stacks are formed over the semiconductor substrate, the semiconductor fins, and the isolation structure.

In accordance with some embodiments, the refill isolation extends through the isolation structure into the semiconductor substrate.

In accordance with some embodiments, the refill isolation is in contact with the isolation structure.

In accordance with some embodiments, the air gap is formed inside the refill isolation, and has an upper gap portion, a lower gap portion opposite to the upper gap portion in a Z direction normal to both the X and Y directions, and a middle gap portion between the upper and lower gap portions. A width of the middle gap portion in the X or Y direction is greater than that of each of the upper and lower gap portions.

In accordance with some embodiments, the air gap is formed inside the refill isolation, and has an upper gap portion and a lower gap portion opposite to the upper gap portion in a Z direction normal to both the X and Y directions. A width of the lower gap portion in the X or Y direction is greater than that of the upper gap portion.

In accordance with some embodiments, the air gap is formed beneath the refill isolation.

In accordance with some embodiments, the semiconductor device includes a plurality of the gate stacks. Two adjacent ones of the gate stacks are spaced apart from each other in the X direction.

In accordance with some embodiments, the semiconductor device further includes a plurality of dielectric portions disposed to alternate with the gate stacks in the X direction.

In accordance with some embodiments, the refill isolation includes an oxygen free dielectric material.

In accordance with some embodiments, a method for making a semiconductor device includes: forming a plurality of semiconductor fins on a semiconductor substrate, each of the semiconductor fins extending in an X direction, two adjacent ones of the semiconductor fins being spaced apart from each other in a Y direction transverse to the X direction; forming at least one gate stack over the semiconductor fins, the gate stack extending in the Y direction; forming at least one trench in the gate stack to partition the gate stack into two stack sections; and forming a refill isolation in the trench such that an air gap is formed in the trench.

In accordance with some embodiments, the refill isolation is formed by non-conformally depositing a refill dielectric layer over the gate stack and the trench, and removing an upper portion of the refill dielectric layer which is formed on the gate stack.

In accordance with some embodiments, the refill dielectric layer is formed using chemical vapor deposition.

In accordance with some embodiments, the semiconductor substrate is rotated when depositing the refill dielectric layer.

In accordance with some embodiments, the upper portion of the refill dielectric layer has a thickness in a Z direction normal to both the X and Y directions, and the refill dielectric layer has a first dimension in the trench in the X direction, and a second dimension in the trench in the Y direction. The thickness of the upper portion of the refill dielectric layer is greater than one half of a larger one of the first and second dimensions.

In accordance with some embodiments, the method further includes: forming two dielectric portions at two opposite sides of the gate stack. The trench is formed by removing a portion of the gate stack whilst partially removing the dielectric portions beside the removed portion of the gate stack.

In accordance with some embodiments, the trench is formed using an etchant which has a higher etching rate for the gate stack than for the dielectric portions.

In accordance with some embodiments, a method for making a semiconductor device includes: forming a plurality of semiconductor fins on a semiconductor substrate, each of the semiconductor fins extending in an X direction, two adjacent ones of the semiconductor fins being spaced apart from each other in a Y direction transverse to the X direction; forming a plurality of gate stacks over the semiconductor fins, each of the gate stacks extending in the Y direction, two adjacent ones of the gate stacks being spaced apart from each other in the X direction; forming at least one trench in at least one of the gate stacks to partition the at least one of the gate stacks into two stack sections one of which is disposed over a group of the semiconductor fins and the other of which is disposed over another group of the semiconductor fins; and forming a refill isolation and an air gap in the trench.

In accordance with some embodiments, the refill isolation and the air gap are formed by: non-conformally depositing a refill dielectric layer over the gate stacks and the trench such that the air gap is formed in the trench inside the refill dielectric layer; and removing an upper portion of the refill dielectric layer which is formed on the gate stacks.

In accordance with some embodiments, the refill isolation and the air gap are formed by: partially filling a sacrificial layer in the trench; forming a porous dielectric layer over the gate stack, the sacrificial layer and the trench; removing an upper portion of the porous dielectric layer which is formed on the gate stacks; and removing the sacrificial layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for making a semiconductor device comprising:
    forming at least one gate stack over a semiconductor substrate in a Z direction, the gate stack extending in a Y direction normal to the Z direction;
    forming at least one trench in the gate stack to partition the gate stack into two stack sections; and forming a refill isolation in the trench such that an air gap is formed in the trench, the refill isolation being formed by non-conformally depositing a refill dielectric layer over the gate stack and in the trench, and removing an upper portion of the refill dielectric layer which is formed on the gate stack, the upper portion of the refill dielectric layer having a thickness in the Z direction, the refill dielectric layer having a first dimension in the trench in an X direction that is normal to both the Y direction and the Z direction, and a second dimension in the trench in the Y direction, the thickness of the upper portion of the refill dielectric layer being greater than one half of a larger one of the first and second dimensions.

2. The method as claimed in claim 1, wherein the refill dielectric layer is formed using chemical vapor deposition.

3. The method as claimed in claim 1, before formation of the at least one gate stack, further comprising:
forming an isolation structure disposed on the semiconductor substrate, the at least one gate stack being formed over the isolation structure opposite to the semiconductor substrate, so that, in the step of forming the refill isolation and the air gap, the refill isolation extends through the isolation structure into the semiconductor substrate.

4. The method as claimed in claim 3, wherein the refill isolation is formed to be in contact with the isolation structure.

5. The method as claimed in claim 1, wherein the semiconductor substrate is rotated when depositing the refill dielectric layer.

6. The method as claimed in claim 1, further comprising:
forming two dielectric portions at two opposite sides of the at least one gate stack, the trench being formed by removing a portion of the at least one gate stack whilst partially removing the dielectric portions beside the removed portion of the at least one gate stack.

7. The method as claimed in claim 6, wherein the trench is formed using an etchant which has a higher etching rate for the gate stack than for the dielectric portions.

8. The method as claimed in claim 1, wherein the air gap is formed inside the refill isolation, and has an upper gap portion, a lower gap portion opposite to the upper gap portion in the Z direction, and a middle gap portion between the upper and lower gap portions, a width of the middle gap portion in the X or Y direction being greater than that of each of the upper and lower gap portions.

9. The method as claimed in claim 1, wherein the air gap is formed inside the refill isolation, and has an upper gap portion and a lower gap portion opposite to the upper gap portion in the Z direction, a width of the lower gap portion in the X or Y direction being greater than that of the upper gap portion.

10. The method as claimed in claim 1, further comprising forming two dielectric portions at two opposite sides of the at least one gate stack, so that, in the step of forming the refill isolation and the air gap, the refill isolation partially extends into the dielectric portions.

11. The method as claimed in claim 1, wherein the refill isolation is made from an oxygen free dielectric material.

12. A method for making a semiconductor device, comprising:
forming a plurality of gate stacks over a semiconductor substrate;
forming at least one trench in at least one of the gate stacks to partition the at least one of the gate stacks into two stack sections; and
forming a refill isolation and an air gap in the trench, the refill isolation and the air gap being formed by
partially filling a sacrificial layer in the trench,
forming a porous dielectric layer over the gate stack, the sacrificial layer, and the trench,
removing an upper portion of the porous dielectric layer which is formed on the gate stacks, and
removing the sacrificial layer.

13. The method as claimed in claim 12, wherein the sacrificial layer is made from a thermal degradable material, an ultraviolet degradable material, or a combination thereof.

14. The method as claimed in claim 12, wherein the sacrificial layer is made from a polyurea-containing material, an acrylate-containing material, a carboxylate-containing material, or combinations thereof.

15. A method for making a semiconductor device, comprising:
forming at least one gate stack having two stack sections that are spaced apart from each other; and
forming a refill isolation and an air gap which are disposed between and separate the stack sections, the refill isolation and the air gap being formed by
forming a sacrificial layer and a porous dielectric layer over the sacrificial layer,
removing an upper portion of the porous dielectric layer to form the refill isolation, and
removing the sacrificial layer to form the air gap.

16. The method as claimed in claim 15, wherein the air gap is formed beneath the refill isolation.

17. The method as claimed in claim 15, wherein the stack sections are spaced apart from each other by a trench, and the refill isolation and the air gap are formed in the trench.

18. The method as claimed in claim 17, further comprising: forming two dielectric portions at two opposite sides of the gate stack, the trench being formed by removing a portion of the gate stack whilst partially removing the dielectric portions beside the removed portion of the gate stack.

19. The method as claimed in claim 15, wherein the sacrificial layer is made from a thermal degradable material, an ultraviolet degradable material, or a combination thereof.

20. The method as claimed in claim 15, wherein the sacrificial layer is made from a polyurea-containing material, an acrylate-containing material, a carboxylate-containing material, or combinations thereof.

* * * * *